(12) United States Patent
Okubo

(10) Patent No.: US 6,351,041 B1
(45) Date of Patent: Feb. 26, 2002

(54) STAGE APPARATUS AND INSPECTION APPARATUS HAVING STAGE APPARATUS

(75) Inventor: Yukiharu Okubo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/626,909

(22) Filed: Jul. 27, 2000

(30) Foreign Application Priority Data

Jul. 29, 1999 (JP) ........................................... 11-215273

(51) Int. Cl.[7] ............................................... H01L 21/00
(52) U.S. Cl. ............................. 310/12; 356/936; 355/72
(58) Field of Search ..................... 33/1 M; 74/471 XY, 74/479.01, 490.09, 490.08; 108/137, 138; 310/12; 355/53, 72; 356/358, 363, 401

(56) References Cited

U.S. PATENT DOCUMENTS

| 4,654,571 A | 3/1987 | Hinds ........................ 318/687 |
| 5,196,745 A | 3/1993 | Trumper ..................... 310/12 |
| 5,925,956 A | 7/1999 | Ohzeki ....................... 310/90.5 |
| 6,028,376 A * | 2/2000 | Osanai et al. ................ 310/12 |

FOREIGN PATENT DOCUMENTS

| WO | 99/23692 | 5/1999 |
| WO | 00/03301 | 1/2000 |

* cited by examiner

Primary Examiner—Nestor Ramirez
Assistant Examiner—Judson Jones
(74) Attorney, Agent, or Firm—Oliff & Berridge, PLC

(57) ABSTRACT

A table moving within a plane parallel with respect to a guide plane of a base is located within an opening of a moveable frame moving along the guide plane so as to be guided in an X-direction by an X-direction guide. The table moves in a Y-direction within the moveable frame. The base member and the moveable frame, the moveable frame and a guide, and the base member and said table member are maintained in a state of non-contact by a hydrostatic pressure gas bearing. A planar motor is comprised of electromagnets provided at the base member and permanent magnets provided at the lower surface of said table member installed on the guide plane for the base. The moveable frame and the table are then levitated and moved in the XY directions by the planar motor.

20 Claims, 34 Drawing Sheets

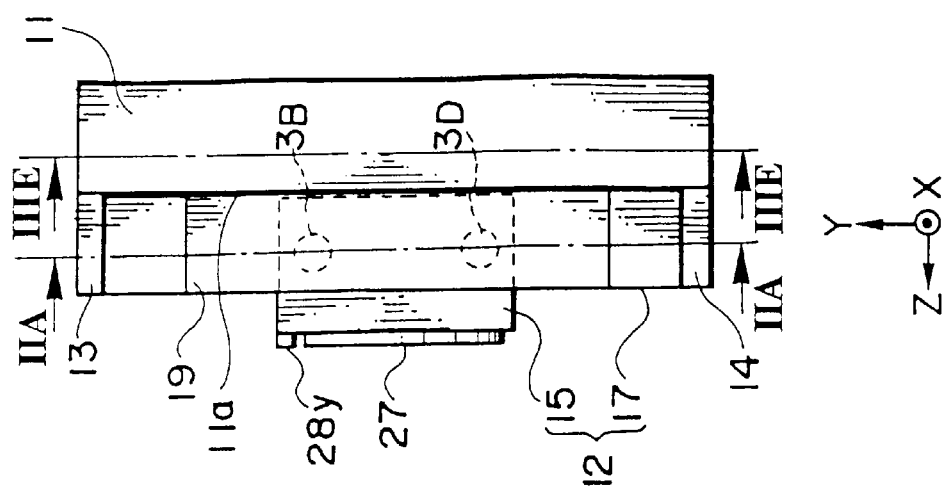
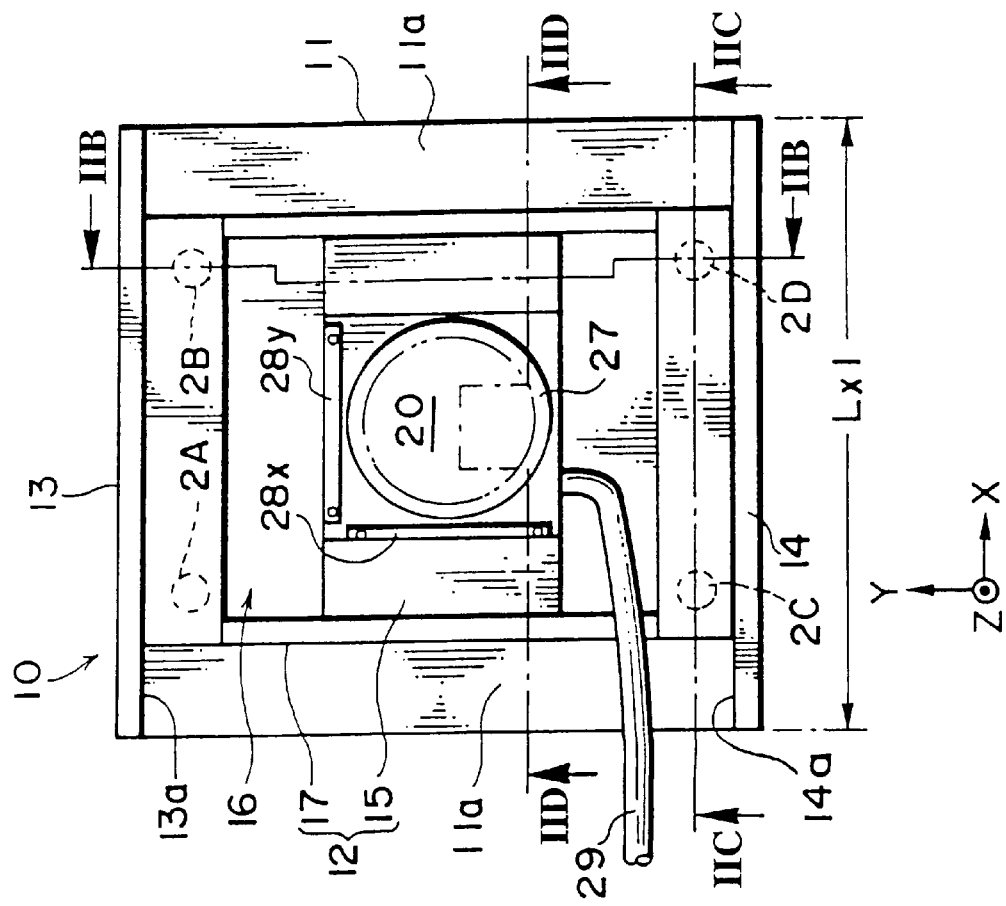

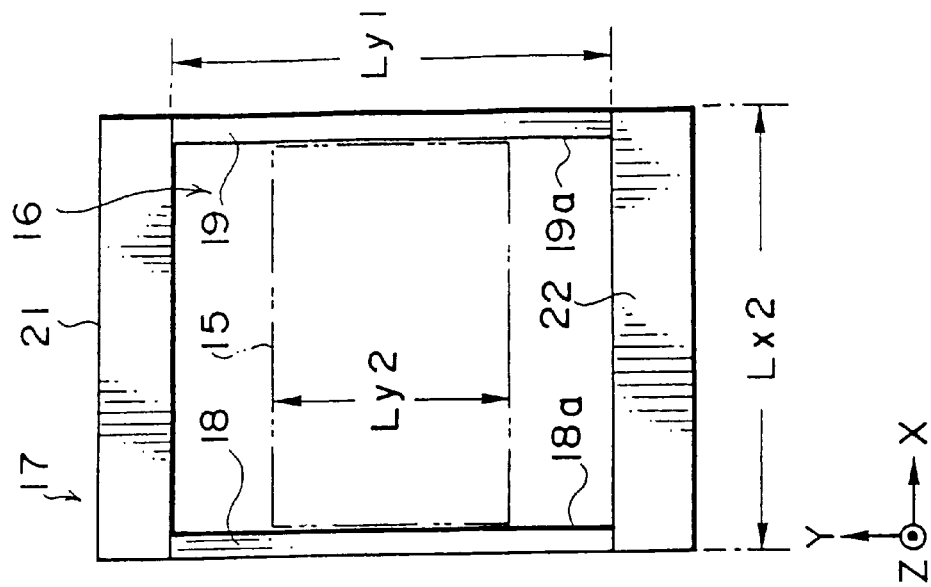
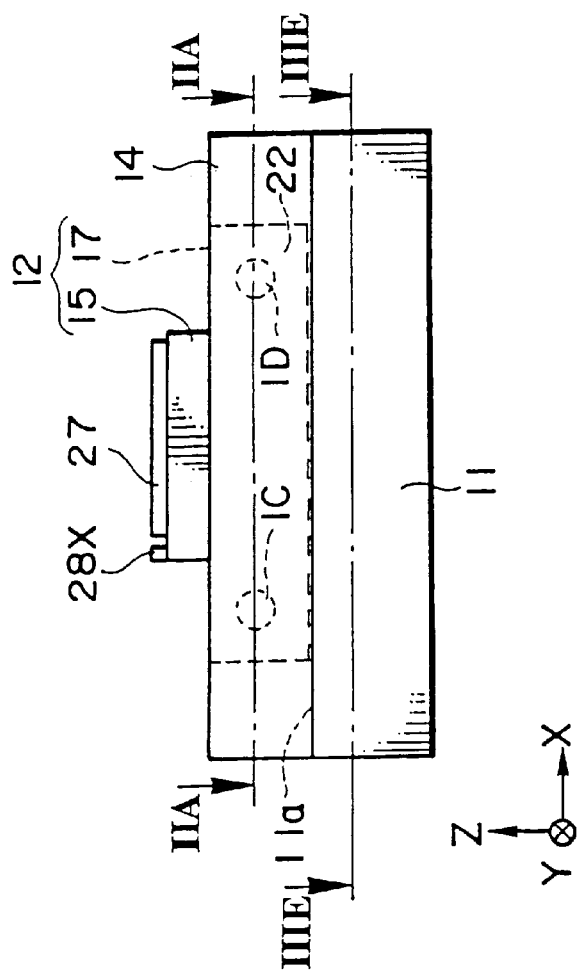
FIG. 1D
FIG. 1C

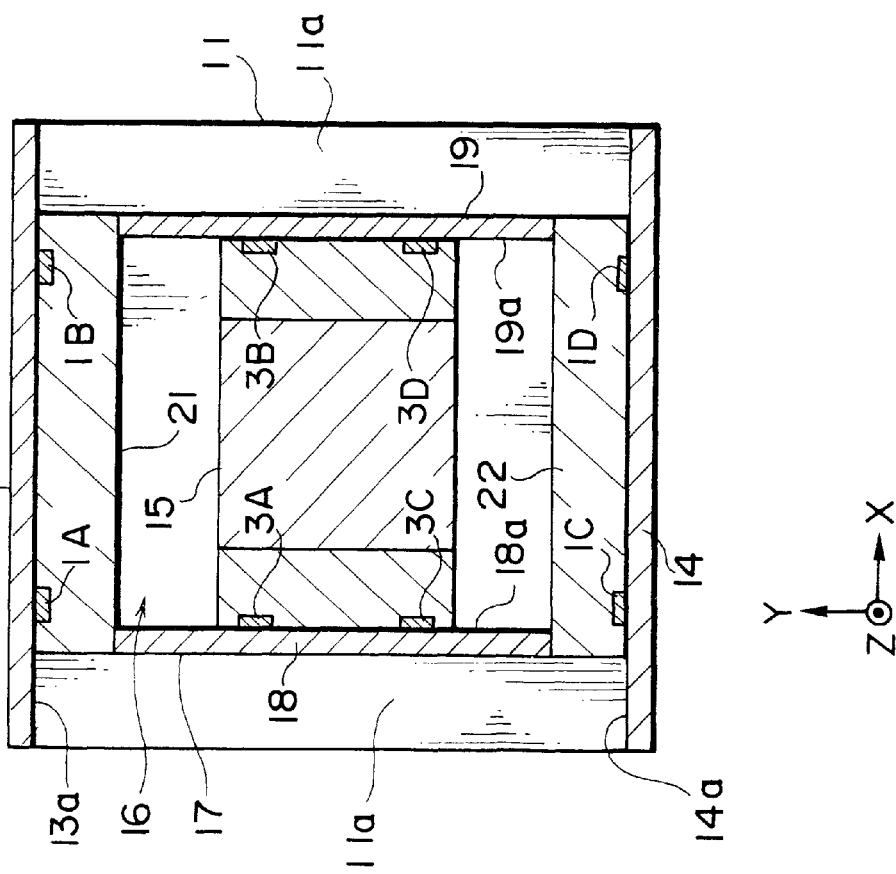
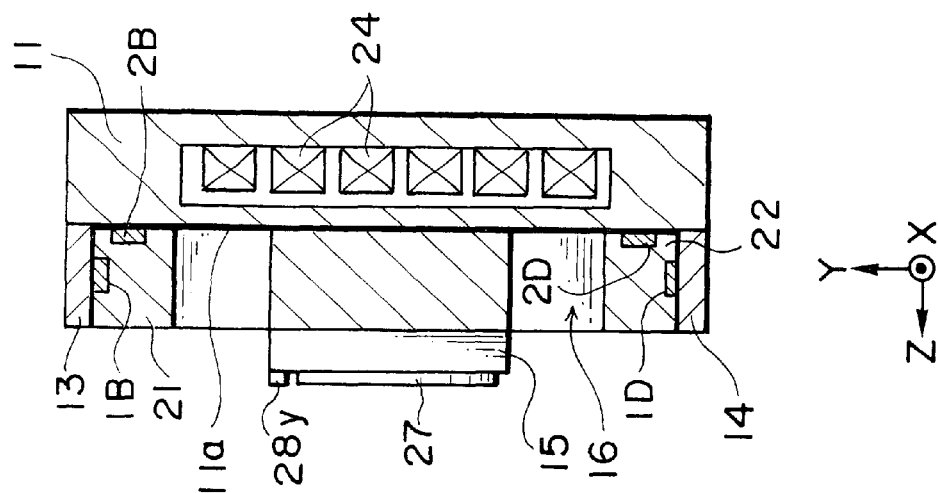
FIG. 2A A-A SECTION
FIG. 2B B-B SECTION

C-C SECTION

D-D SECTION

E-E SECTION

F-F SECTION

G-G SECTION

B-B SECTION

A-A SECTION

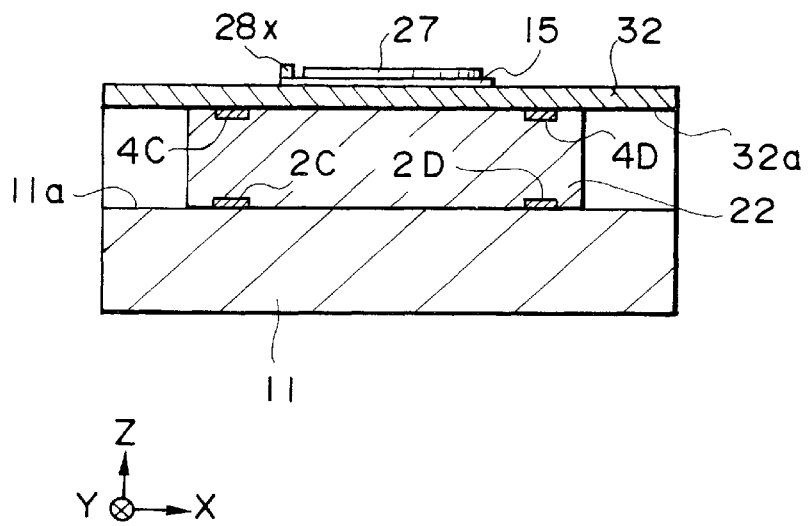
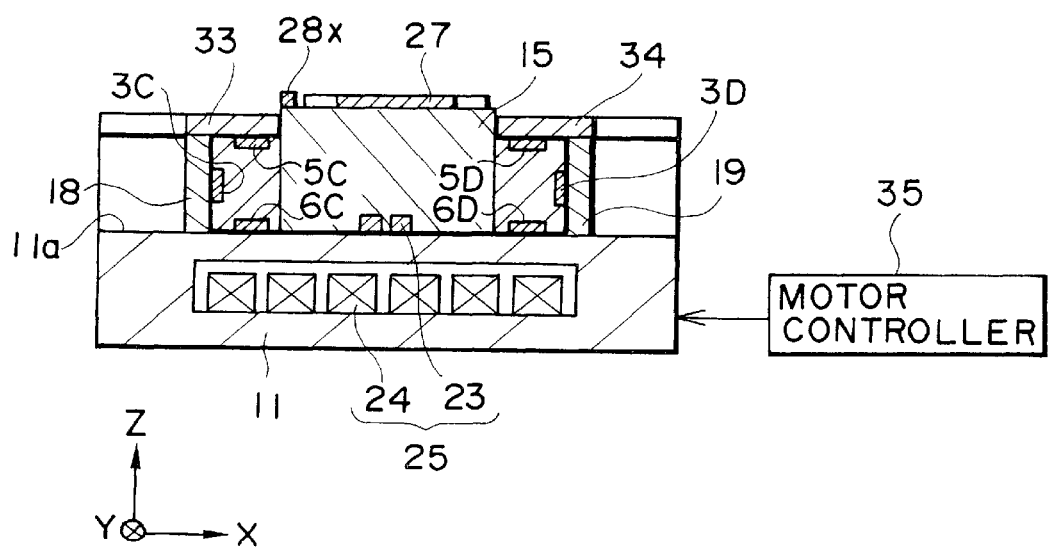

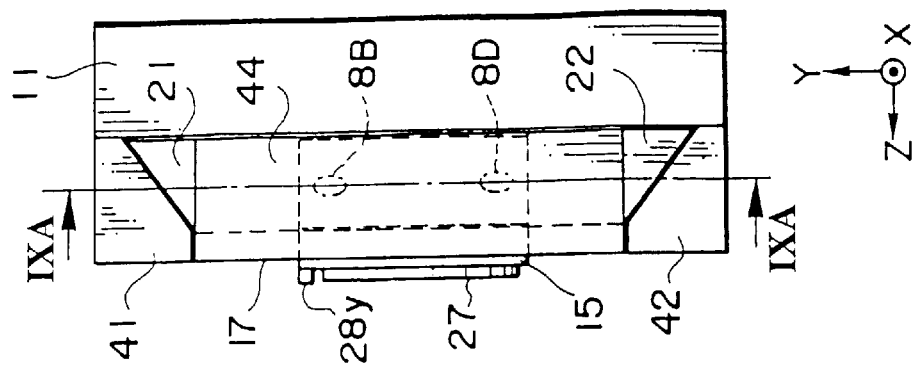
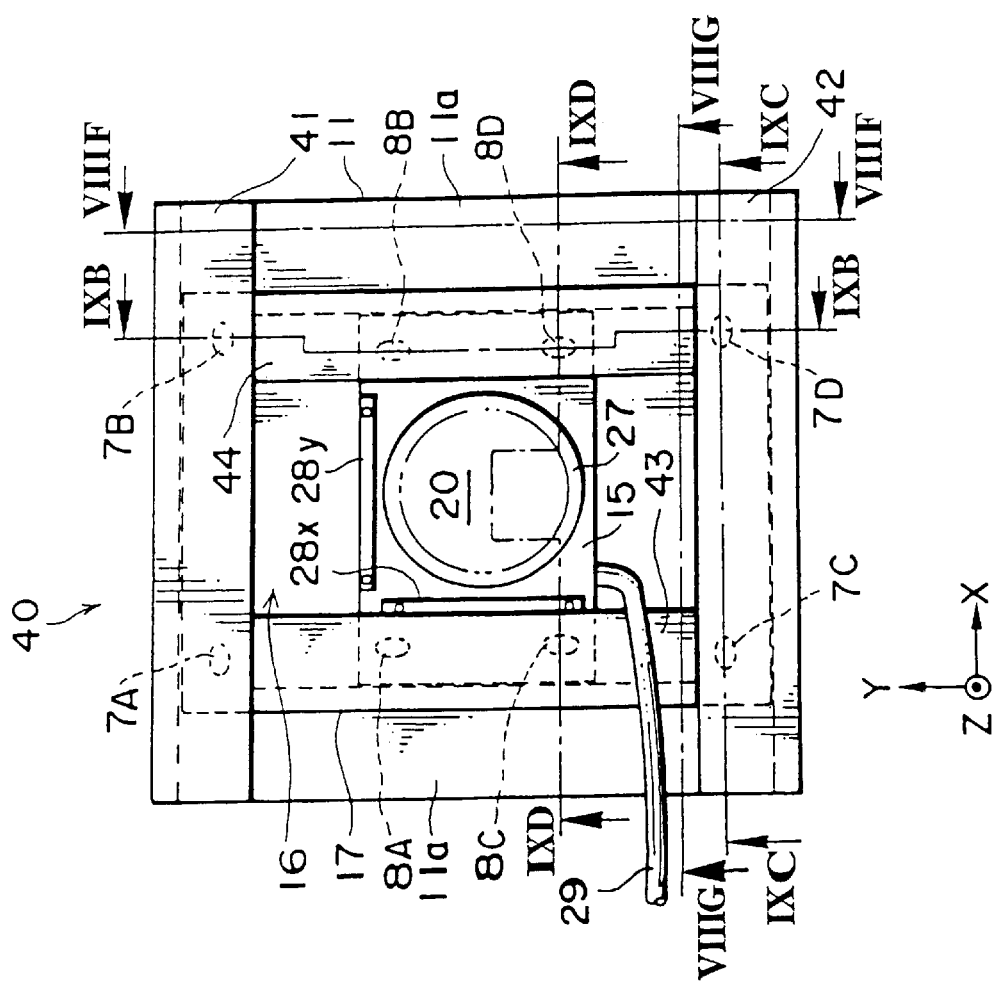

F-F SECTION

G-G SECTION

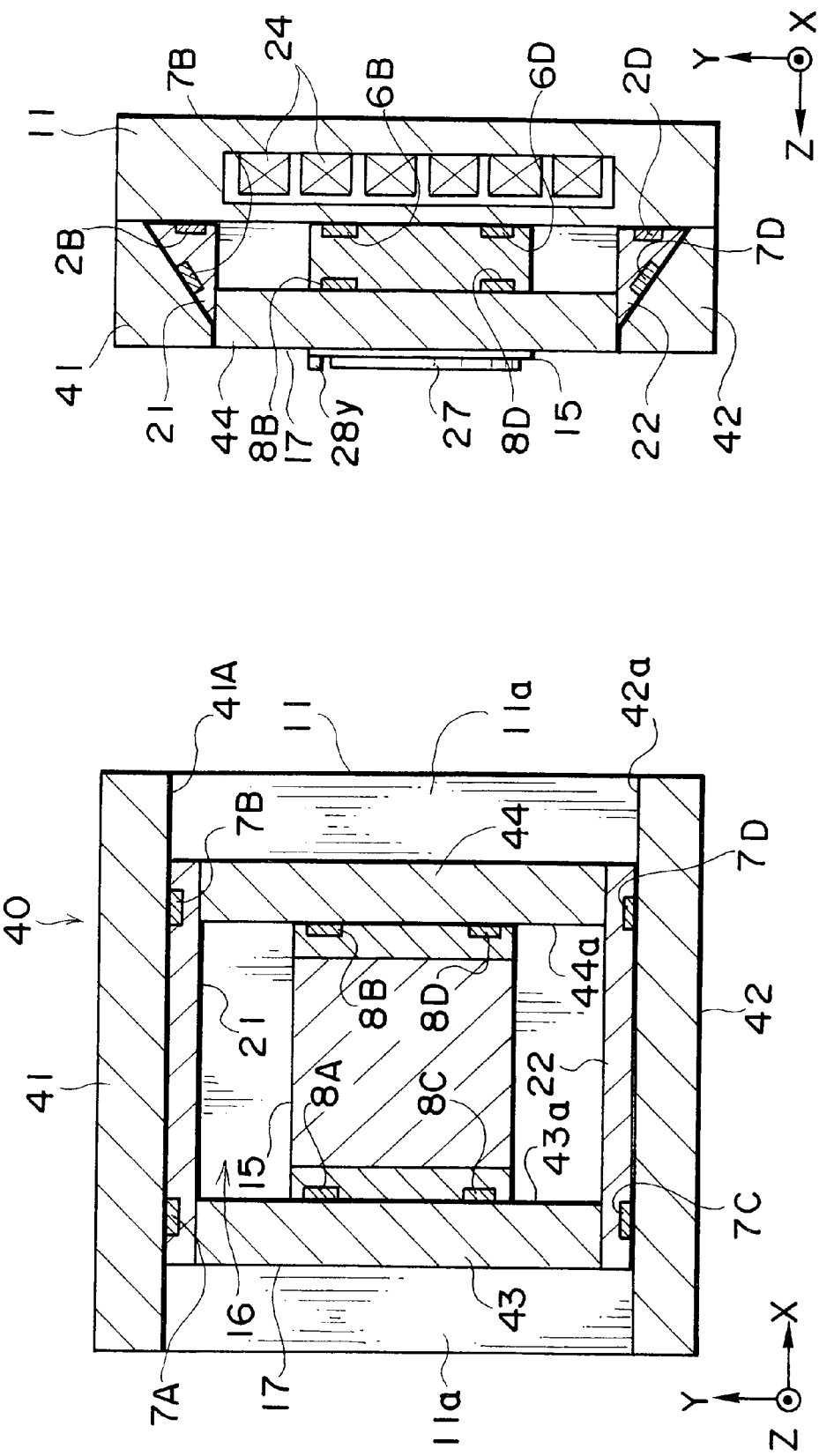

C-C SECTION

D-D SECTION

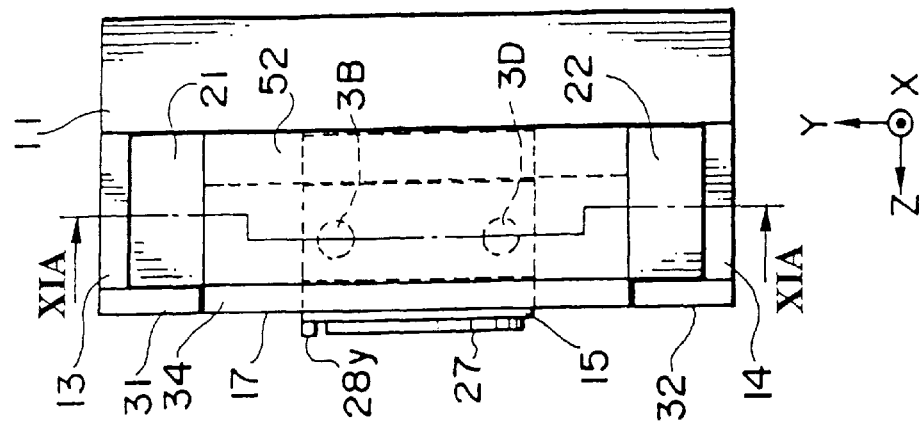
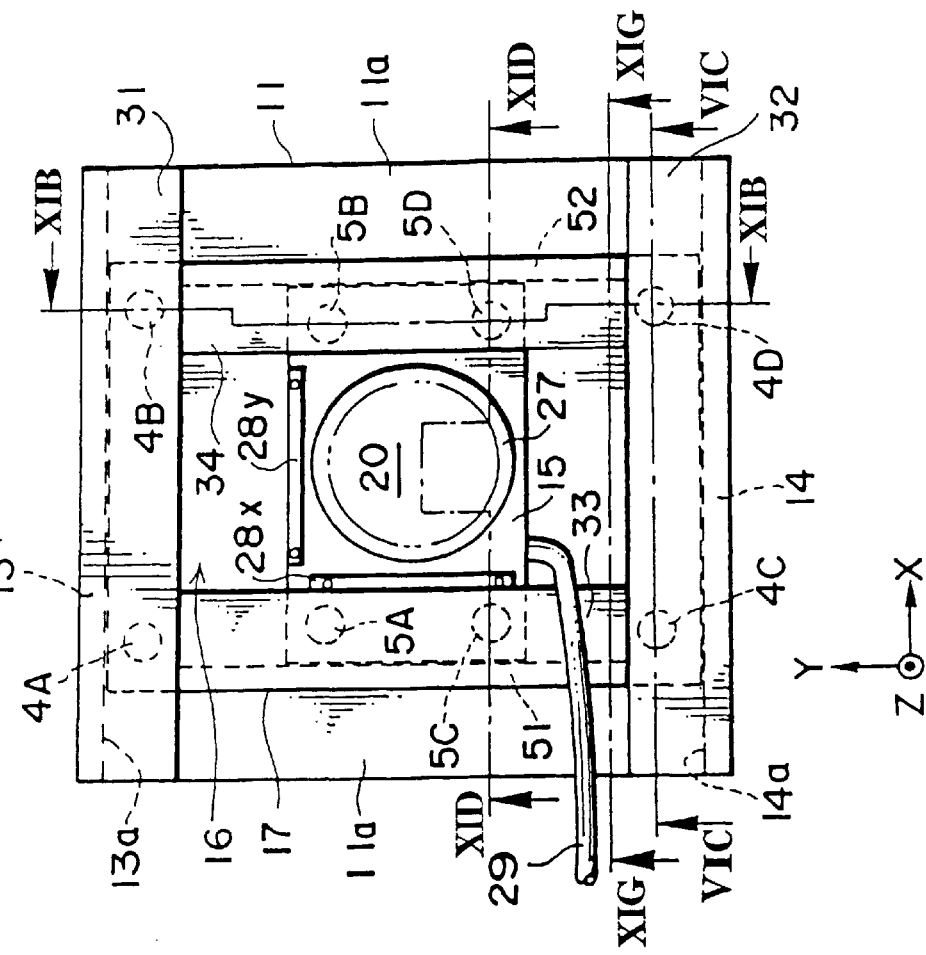

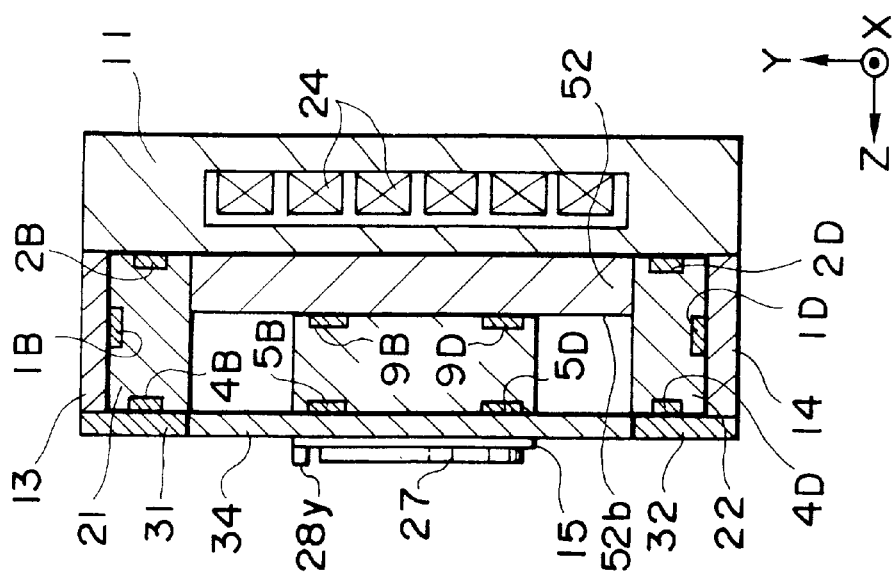
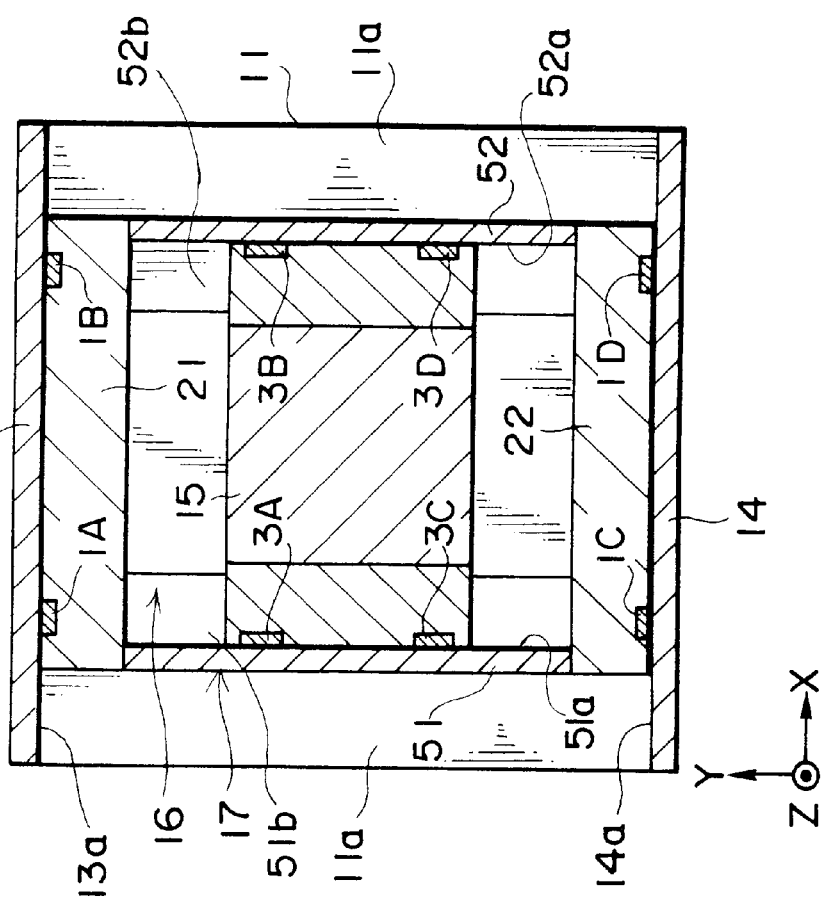

G-G SECTION

D-D SECTION

F I G. 13 C
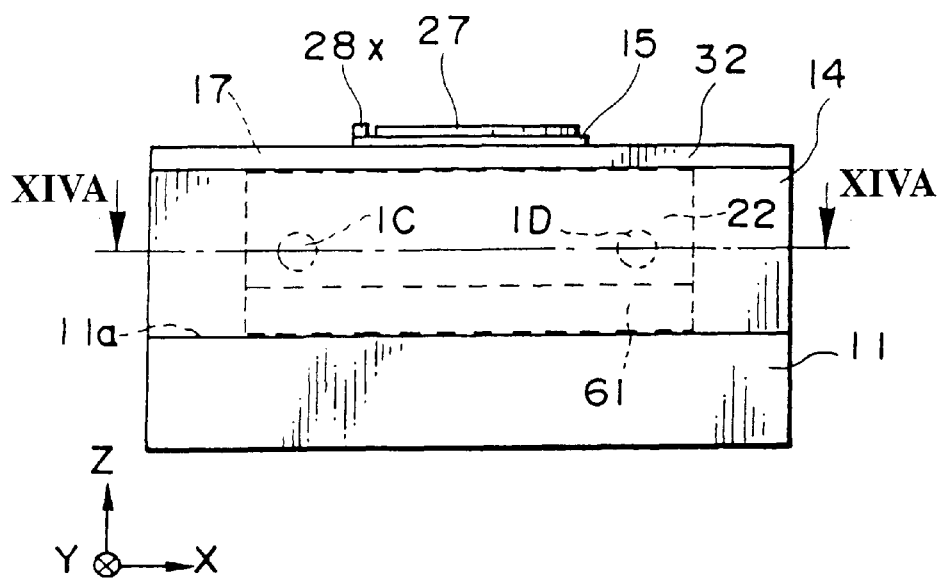
F I G. 13 D
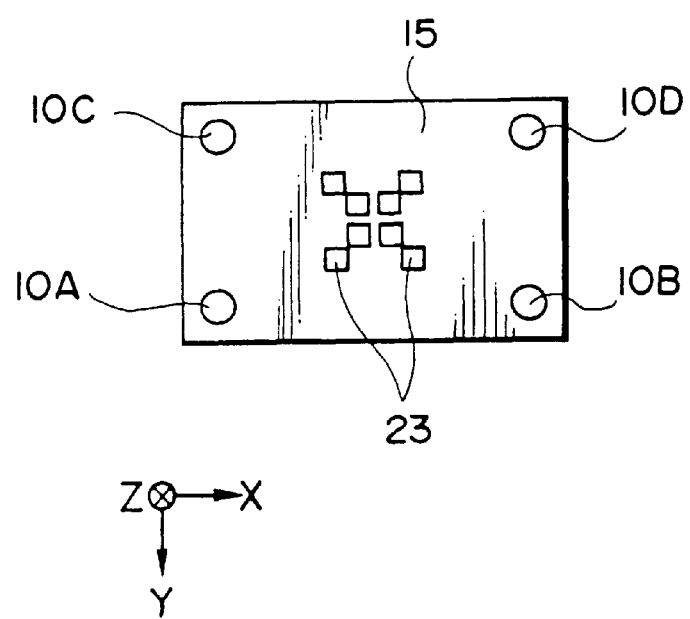

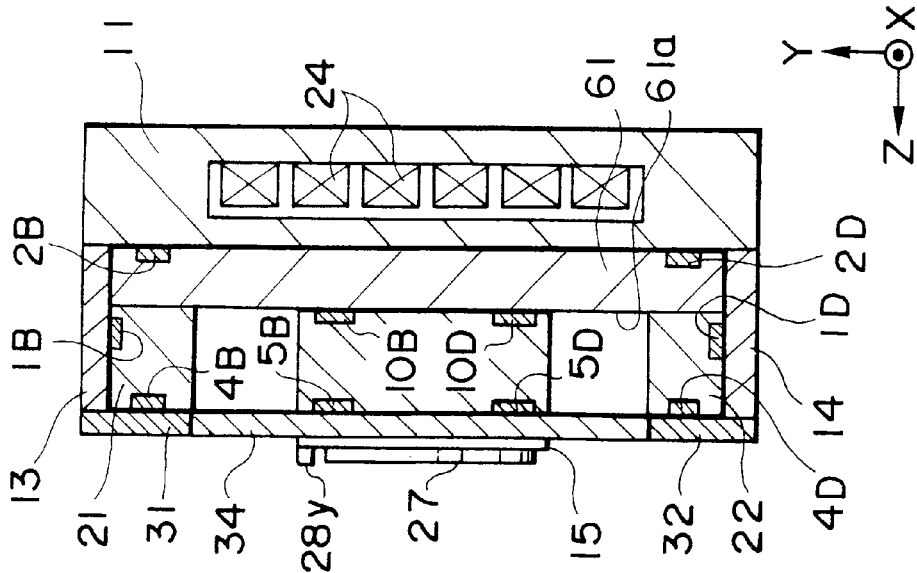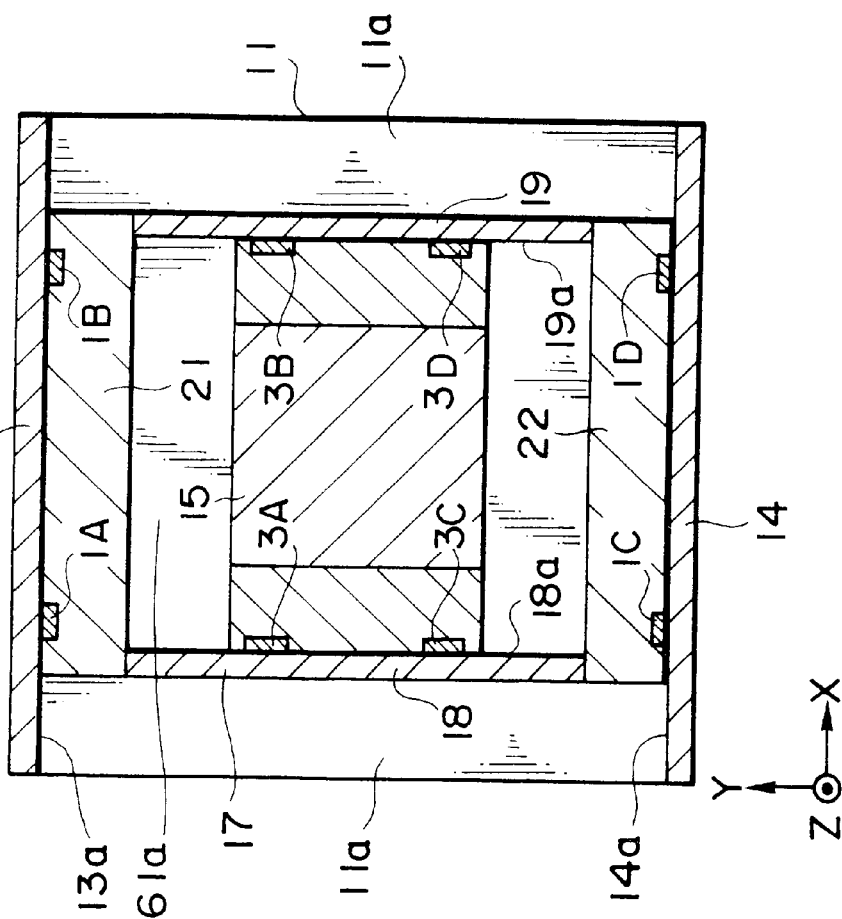

C-C SECTION

D-D SECTION

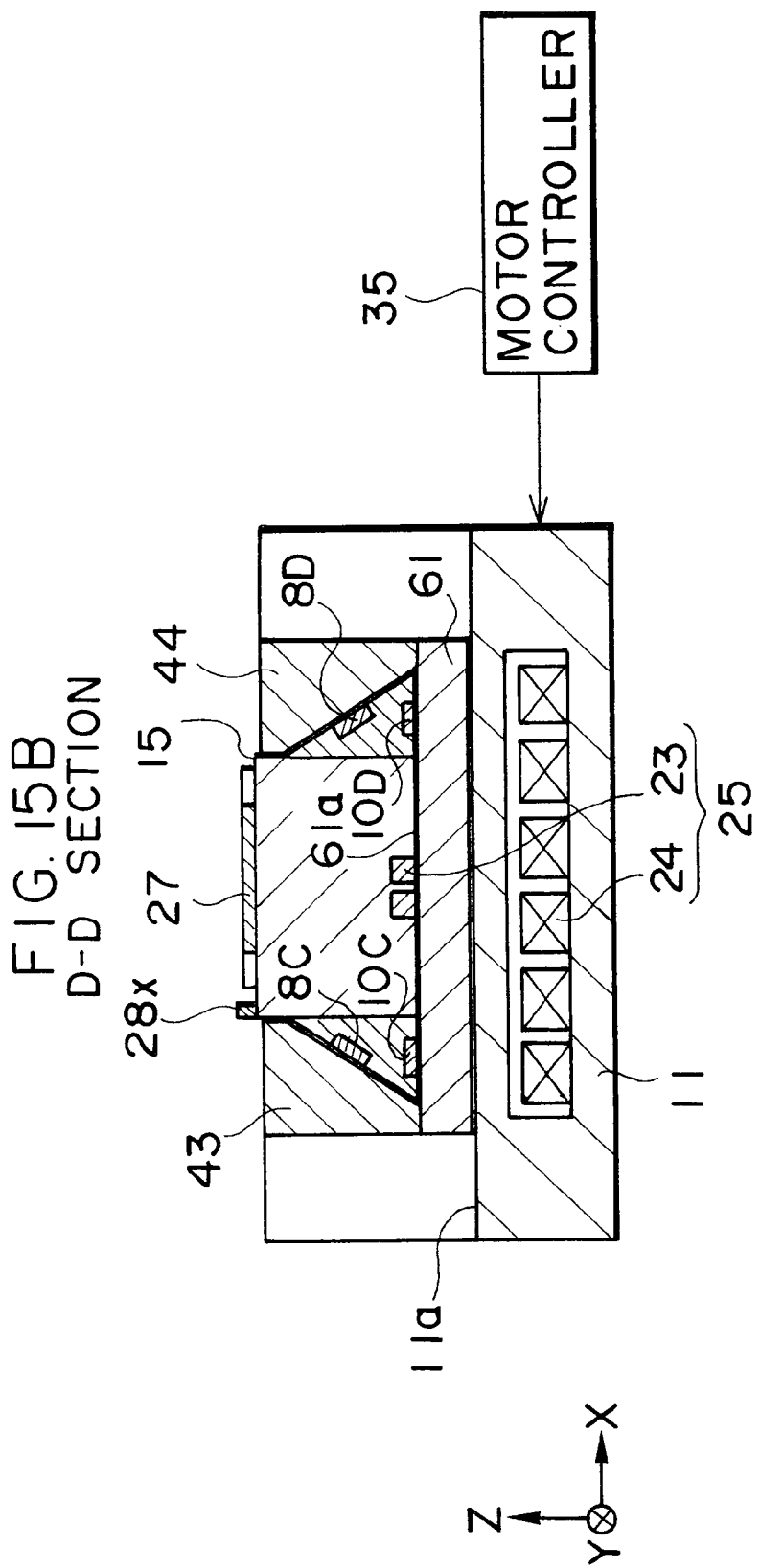

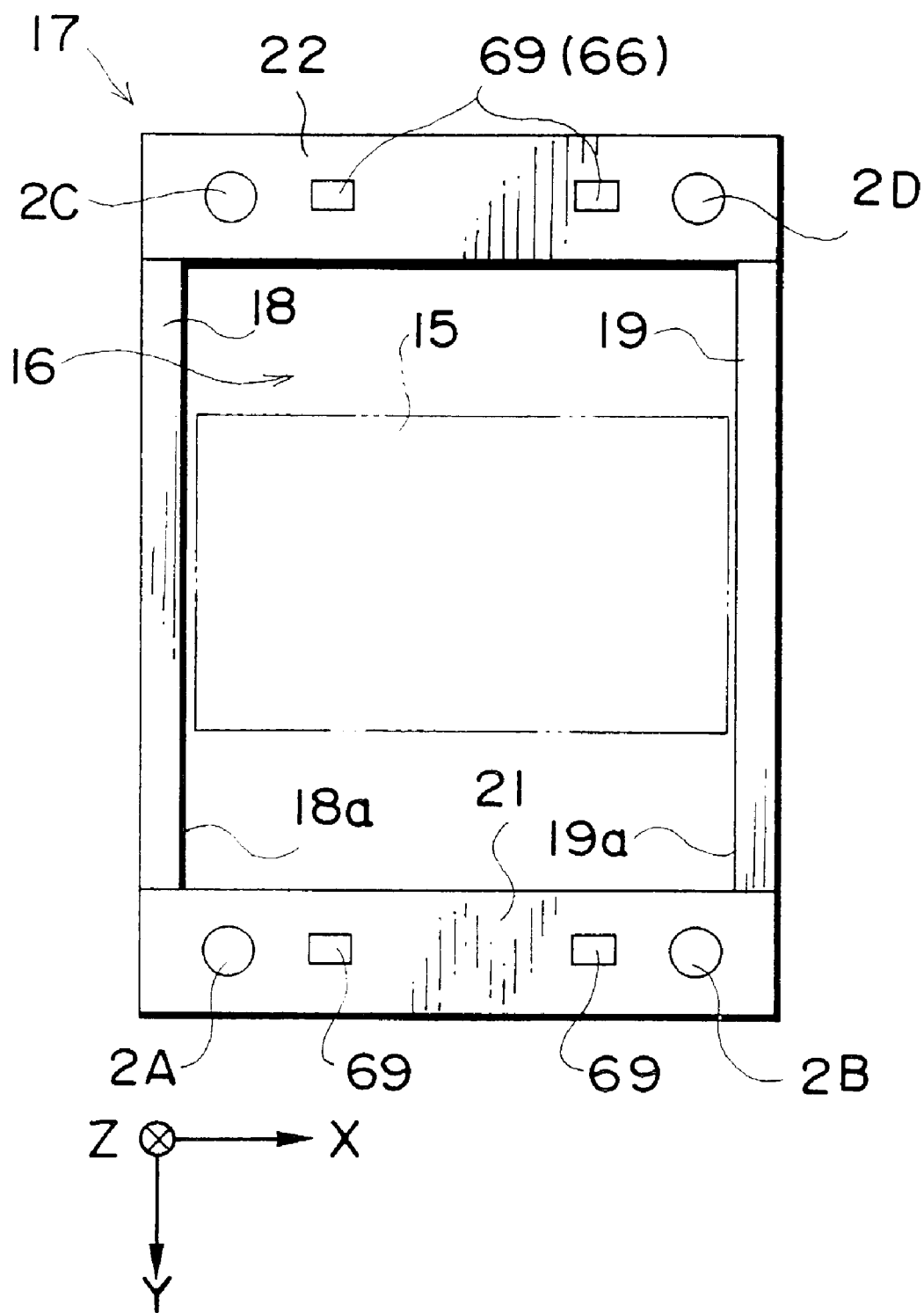

STAGE APPARATUS AND INSPECTION APPARATUS HAVING STAGE APPARATUS

INCORPORATION BY REFERENCE

The disclosure of the following priority application is herein incorporated by reference:

Japanese Patent Application No. 11-2152273 filed Jul. 29, 1999.

BACKGROUND OF THE INVENTION

1. Field of the Invention

The present invention relates to stage apparatus for positioning a sample with high precision within a two-dimensional plane, and an inspection apparatus having the stage apparatus.

2. Description of the Related Art

Conventional stage apparatus are used with exposure apparatus for manufacturing semiconductor devices etc. using lithographic processes, inspection apparatus for inspecting circuit patterns formed on the semiconductor devices, and with ultraprecise manufacturing apparatus, and are used to position samples such as wafers, etc. within a two-dimensional plane in a highly-precise manner.

For example, as shown in FIG. 21, a magnetic levitation-type stage apparatus 200 disclosed in Japanese Patent Laid-open Publication No. Hei. 9-17846 comprises a rectangular fixed stage 211 and a rectangular moving stage 212 smaller than the fixed stage 211 and the sample is mounted on the moving stage 212. The fixed stage 211 comprises a multiplicity of magnets 213 arranged in longitudinal and lateral direction, and a sealed tank 214 for housing the magnets 213. An upper plate of the sealed tank 214 is made of a material with a low permeability. Six permanent magnets 215 and three gap sensors 216 are fitted to the bottom surface of the moving stage 212 levitated above the fixed stage 211. The three gap sensors 216 measure the position of the moving stage 212 in a direction Z and inclination in directions α and β, taking the upper plate of the sealed tank 214 as a reference.

Three laser interferometers 217 are provided about the periphery of the fixed stage 211. The three laser interferometers 217 measure the position of the moving stage 212 in directions X and Y, and inclination in a direction θ.

The magnets 213 and the permanent magnets 215 constitute a planar motor. Attractive force, repulsion, and Lorentz's force are generated by supplying current to the magnets 213 of the planar motor so that the moving stage 212 can be driven.

At the stage apparatus 200, control apparatus (not shown) receiving information from the gap sensors 216 and the laser interferometers 217 controls the current of the magnets 213 so as to drive the moving stage 212 to the desired position and posture. The position of samples such as wafers etc. mounted on the moving stage 212 can therefore be decided with six degrees of freedom in the direction X, Y, Z, θ, α and β.

Degassification from the magnets 213 is prevented because the magnets 213 are housed within the sealed tank 214 and the stage apparatus 200 can therefore be employed not just in the atmosphere, but can also operate in clean rooms and in a vacuum.

On the other hand, as shown in FIG. 22, with a stage apparatus 300 disclosed in Japanese Patent Laid-open Publication No. Hei. 3-73513, slide sections 301x and 301y are moved along guide rails 302x and 302y by drive screws 303x and 303y, with the guide rail 302y being fixed to the slide section 301x.

At the slide sections 301x and 301y, supply pipes 304x and 304y for supplying high-pressure gas (dry air) are connected to a gap between the slide sections 301x and 301y and the guide rails 302x and 302y.

Gas exhaust sections 309x and 309y are fitted to the slide sections 301x and 301y and are connected to exhaust pipes 310x and 310y linked to a vacuum pump (not shown).

At the stage apparatus 300, high-pressure gas supplied from the supply pipes 304x and 304y to the gap between the slide sections 301x and 301y and the guide rails 302x and 302y then flows in the direction of a gap between the gas exhaust sections 309x and 309y and the guide rails 302x and 302y and is discharged rapidly to outside of the vacuum chamber via the exhaust pipes 310x and 310y.

The slide sections 301x and 301y (and the gas exhaust sections 309x and 309y) therefore move in directions X and Y while being levitated from the guide rails 302x and 302y. A sample 313 is mounted at a table 308 on the slide section 301y.

With the stage apparatus 300 where bearings for X and Y-directions are static pressure gas bearing slides, high pressure gas for levitating the slide sections 301x and 301y (gas exhaust sections 309x and 309y) from the guide rails 302x and 302y is released to the outside of the vacuum chamber and use in a vacuum or special gas is possible.

However, with the magnetic levitation-type stage apparatus 200 (FIG. 21) described above, all positions and postures of the moving stage 212 have to be simultaneously controlled by the planar motor constituted by the magnets 213 and the permanent magnets 215 (control of six axes) and it is necessary to drive the multiplicity of magnets 213 independently, which requires an extremely complex control system.

Cables (not shown) etc. fitted to the moving stage 212 are influence by pulling force and vibrations (disturbances) and it is therefore difficult to exert control in such a manner that inter-axial interference does not occur, even with a complex control system. This puts a limit on the extent to which positioning precision can be improved with the related stage apparatus 200.

With the stage apparatus 300 (FIG. 22) provided with the static pressure gas bearings, the exhaust pipes 310x and 310y are constituted by metal bellows-like members which ensure that the exhaust pipes 310x and 310y while at the same time ensuring that the exhaust pipes 310x and 310y extend and contract. However, it is difficult to smoothly extend and contract according to movement of the slide sections 301x and 301y.

There are therefore cases where unnecessary reactive force is applied to the slide sections 301x and 301y from the metal bellows-like members when the slide sections 301x and 301y move and this places limitations on the extent to which positioning precision can be improved.

SUMMARY OF THE INVENTION

It is therefore the object of the present invention to provide a stage apparatus where even if a control system for a planar motor constituting a drive source is simplified, inter-axial interference is suppressed and highly precise positioning is possible.

It is a further object of the present invention to provide inspection apparatus capable of improving the precision of positioning a sample mounted on a table.

It is a still further object of the present invention to provide beam irradiation apparatus capable of improving the precision of positioning a sample mounted on a table.

The stage apparatus of the present invention comprises a base member, a table member provided at the base member and moving within a plane parallel to a guide plane, a first guide member for guiding the table member in a first direction and moving along the guide plane, a second guide member for guiding the first guide member in a second direction perpendicular with respect to the first direction, a non-contact bearing for providing guidance and support in such a manner that there is no contact between the base member, table member and second guide member, and the first guide member, a planar motor constituted by magnets provided at one of either the base member or the table member and electromagnets provided at the remaining one of either the base member or the table member, and movement control apparatus for controlling the planar motor, generating drive force in directions parallel to the guide plane, and moving the table member.

In this stage apparatus, the first guide member is provided with an opening penetrating to the guide plane so that the table member moves along the guide plane within the opening and is provided with levitation apparatus for causing the table member to levitate away from the guide plane within the opening.

The stage apparatus comprises a first urging device for urging the table member towards the guide plane, and a second urging device for urging the first guide member towards the guide plane. The first urging device comprises a first urging member provided integrally with the first guide member. It is advantageous to provide a non-contact bearing which provides guidance and support in a non-contact manner between the first urging member and the table member. The second urging device comprises a second urging member provided integrally with the second guide member. It is advantageous to provide a non-contact bearing which provides guidance and support in a non-contact manner between the second urging member and the first guide member.

With this stage apparatus, it is advantageous to provide the second guide member integrally with the base member. The levitation apparatus is constituted of a levitation control apparatus for controlling the planar motor so as to generate drive force in directions parallel to the normal of the guide plane.

The levitation apparatus can also be a static pressure bearing which provides guidance and support in a non-contact manner between the table member and the guide plane using fluid. The non-contact bearing can also be a static pressure bearing which provides guidance and support via a fluid. The static pressure bearing can be a static pressure gas bearing employing gas as a fluid. The static pressure bearing can comprise pads for expelling fluid and a discharge unit provided about the pads for discharging fluid expelled from the pads.

An inspection apparatus of the present invention comprises the aforementioned stage apparatus, a irradiation device for irradiating a sample mounted at the stage apparatus with a beam and detection means for detecting a secondary beam generated from the sample as a result of being irradiated with the beam.

The stage apparatus can also further comprise a guide member driver for generating drive force with respect to the first guide member in directions parallel to the guide plane. The guide member driver can be provided at the base member adjacent to the planar motor and can be embedded in the base member.

The guide member driver can be located along the direction of movement of the first guide member and the first guide member of the stage apparatus can be fitted into the table member.

The beam irradiation apparatus of the present invention is equipped with a irradiation unit for irradiating a sample mounted at the stage apparatus with a beam. A mask having a pattern to be transferred to the sample is located between the irradiation unit and the sample and the pattern of the mask is projected onto the sample using the beam official irrdiates form the irradiation unit in accordance with movement of the stage apparatus. The stage apparatus can therefore be located within a vacuum with this beam irradiation apparatus.

BRIEF DESCRIPTION OF THE DRAWINGS

FIG. 1A is a plan view, FIGS. 1B and 1C are side views of a stage apparatus 10, and FIG. 1D is a plan view of a moveable frame 17 of the stage apparatus 10.

FIG. 2A is a cross-sectional view along IIA—IIA (hereinafter referred to as A—A) of FIG. 1B of the stage apparatus 10, FIG. 2B is a cross-sectional view along IIB—IIB (hereinafter referred to as B—B) of FIG. 1A of the stage apparatus 10.

FIG. 6C is a cross-sectional view along VIC—VIC (hereinafter referred to as C—C) of FIG. 4A of the stage apparatus 30, and FIG. 6D is a cross-sectional along VID—VID (hereinafter referred to as D—D) of FIG. 4A of the stage apparatus 30.

FIG. 7A is a plan view and FIGS. 7B and 7C are side views of a stage apparatus 40.

FIG. 9A is a cross-sectional view along IXA—IXA (hereinafter referred to as A—A) of FIG. 7B of the stage apparatus 40, FIG. 9B is a cross-sectional view along IXB—IXB (hereinafter referred to as B—B) of FIG. 7A of the stage apparatus 40.

FIG. 10A is a plan view of a stage apparatus 50, FIG. 10B and FIG. 10C are side views of the stage apparatus 50.

FIG. 11A is a cross-sectional view along XIA—XIA (hereinafter referred to as A—A) of FIG. 10B of the stage apparatus 50, FIG. 11B is a cross-sectional view along IXB—IXB (hereinafter referred to as B—B) of FIG. 10A of the stage apparatus 50.

FIGS. 13B and 13C are side views of the stage apparatus 60, and FIG. 13D is a plan view of the table 15 of the stage apparatus 60.

FIG. 14A is a cross-sectional view along XIVA—XIVA (hereinafter referred to as A—A) of FIG. 13B of the stage apparatus 60, FIG. 14B is a cross-sectional view along XIVB—XIVB (hereinafter referred to as B—B) of FIG. 13A of the stage apparatus 60.

FIG. 15A is a plan view of a stage apparatus 65 and FIG. 15B is a cross-sectional view along XVD—XVD (hereinafater referred to as D—D) of FIG. 15A of the stage apparatus 65.

FIG. 16C is a plan view of the movable frame 17, illustrating the auxiliary motor.

DESCRIPTION OF THE PREFERRED EMBODIMENTS

Figure 2C:
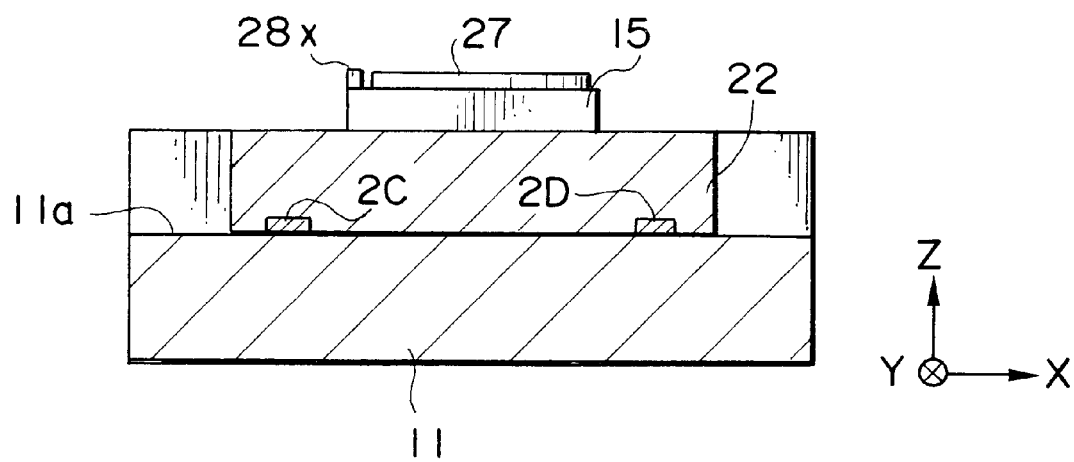
FIG. 2C is a cross-sectional view along IIC—IIC (hereinafter referred to as C—C) of FIG. 1A of the stage apparatus 10 and FIG. 2D is a cross-sectional view along IID—IID (hereinafter referred to as D—D) of FIG. 1A of the stage apparatus 10.

The following is a description, using the drawings, of preferred embodiments of the present invention.

First Embodiment

First, a description is given of a first embodiment.

As shown in FIG. 1A which is a view of a stage apparatus 10 from above, and FIG. 1B and FIG. 1C showing side views of the same, the stage apparatus 10 of the first embodiment comprises a stage base 11 having a reference guide plane 11a parallel with an XY plane, a moveable section 12 capable of being moved along the reference guide plane 11a, and X-guides 13 and 14, fixed to a side of the reference guide plane 11a of the stage base 11, for supporting and guiding in the X-direction the whole of the moveable section 12.

The moveable section 12 comprises a table 15 mounted with a sample 20 (for example, a wafer), and a moveable frame 17 having a rectangular opening 16 penetrating as for as the reference guide plane 11a. The table 15 is positioned within the opening 16 of the moveable frame 17.

As shown in FIG. 1D, the moveable frame 17 comprises Y-guides 18 and 19 supporting the table 15 positioned within the opening 16 from the side and providing guidance in the Y-direction, and coupling sections 21 and 22 coupling with the Y-guides 18 and 19. Guide planes 18a and 19a parallel with a YZ plane and facing each other are provided at the Y-guides 18 and 19 of the moveable frame 17.

A space between the guide planes 18a and 19a is slightly broader than a length of the table 15 in the X-direction. Because of this, the table 15 and the Y-guides 18 and 19 (moveable frame 17) are usually capable of movement in the X-direction in an integral manner. A length Ly1 along the Y-direction of each of the guide planes 18a and 19a is longer than a length Ly2 along the Y-direction of the table 15 by a prescribed amount (Ly1–Ly2). This prescribed amount (Ly1–Ly2) corresponds to the maximum amount of movement along the Y-direction of the table 15.

As shown in FIG. 1A, guide planes 13a and 14a parallel with an XZ plane and facing each other are provided at the X-guides 13 and 14 for guiding the moveable frame 17 (and the table 15 positioned within the opening 16) in the X-direction. The space between the guide planes 13a and 14a is slightly broader than the length of the moveable frame 17 in the Y-direction.

A length Lx1 along the X-direction of each of the guide planes 13a and 14a is slightly longer then a length Lx2 (refer to FIG. 1D) along the X-direction of the moveable frame 17 by a prescribed amount (Lx1–Lx2). This prescribed amount (Lx1–Lx2) corresponds to the maximum amount of movement along the X-direction of the moveable frame 17, i.e. to the maximum amount of movement along the X-direction of the table 15.

As shown in the cross-sectional view of FIG. 2A taken along A—A of FIG. 1B and FIG. 1C, and the cross-sectional view of FIG. 2B taken along B—B of FIG. 1(a), air pads 1A, 1B, 1C and 1D are provided at planes facing the guide planes 13a and 14a of the X-guides 13 and 14 at the coupling sections 21 and 22 of the moveable frame 17. The air pads 1A, 1B, 1C and 1D are connected to an air supply source (not shown).

As shown in FIG. 2B and the cross-sectional view of FIG. 2C taken along C—C of FIG. 1A, air pads 2A, 2B, 2C and 2D (refer to FIG. 1A) are provided at a plane facing the reference guide plane 11a of the stage base 11 at the coupling sections 21 and 22 of the moveable frame 17. The air pads 2A, 2B, 2C and 2D are connected to an air supply source (not shown).

Figure 2D:
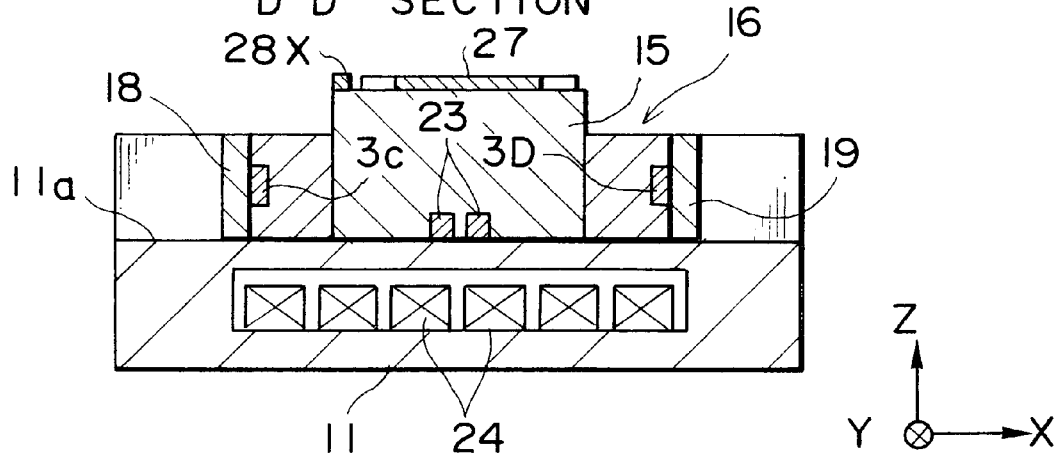

As shown in FIG. 2A and the cross-sectional view of FIG. 2D taken along D—D of FIG. 2A and FIG. 1A, air pads 3A, 3B, 3C and 3D are provided at planes facing the guide planes 18a and 19a of the Y-guides 18 and 19 constituting the moveable frame 17 at the table 15. The air pads 3A, 3B, 3C and 3D are connected to an air supply source (not shown).

Figure 3A:
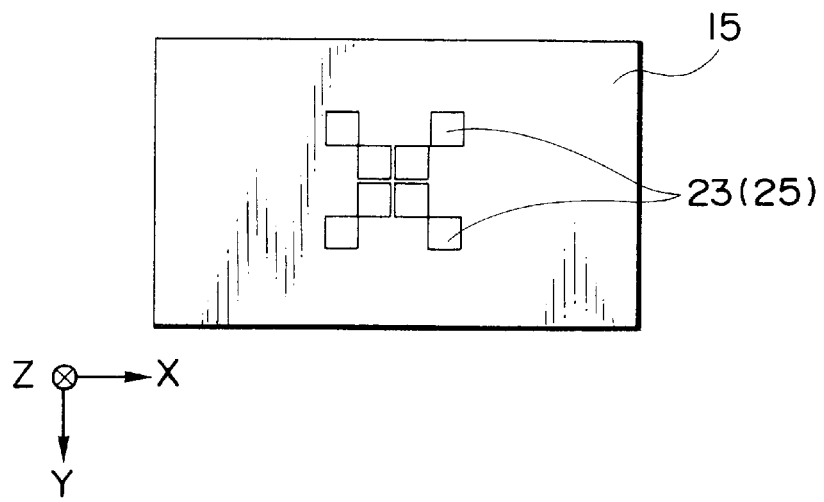
FIG. 3A is a view from below of a table 15 and FIG. 3B is a cross-sectional view along IIIE—IIIE (hereinafter referred to as E—E) of FIG. 1B of the stage apparatus 10.

As shown in FIG. 2D, a plurality of permanent magnets 23, 23, . . . are provided at a plane facing the reference guide plane 11a of the stage base 11 of the table 15. The positioning of the permanent magnets 23, 23, . . . is as shown in FIG. 3A where the table 15 is viewed from the side of the reference guide plane 11a. Eight permanent magnets 23, 23, . . . are shown in FIG. 3A.

Figure 3B:
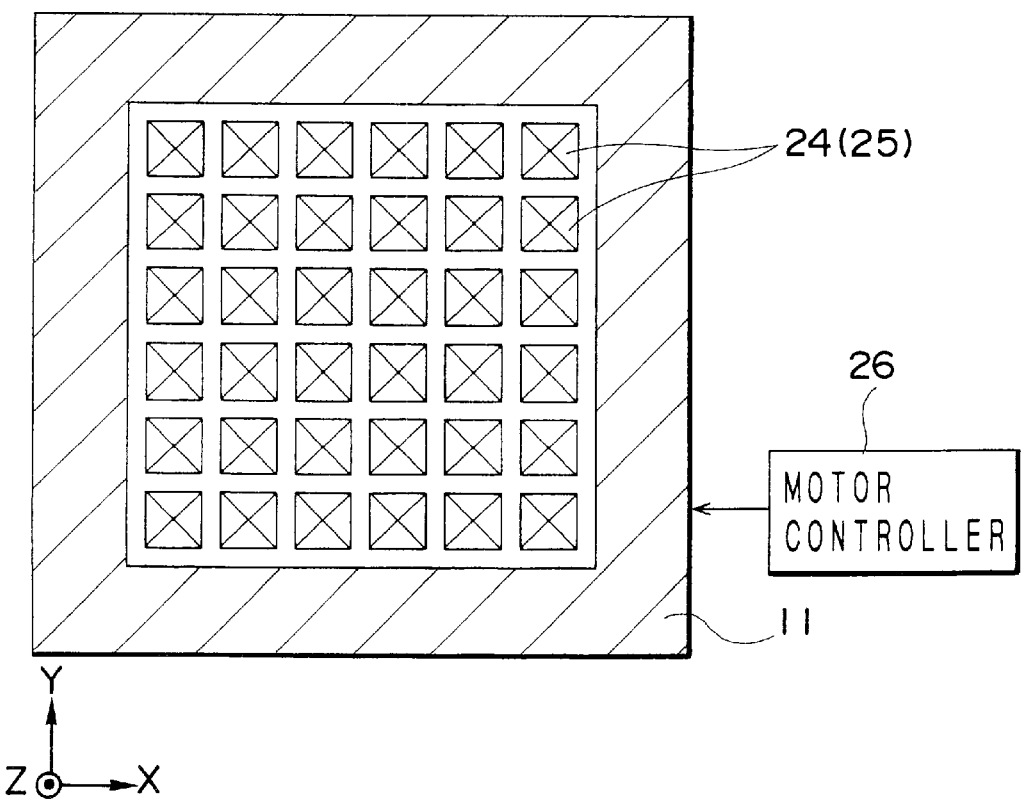

As shown in FIG. 2B and FIG. 2D, a plurality of electromagnets 24, 24, . . . are then provided within the reference guide plane 11a. The electromagnets 24, 24, . . . are arrayed in the shape of a matrix, as shown in the cross-sectional view FIG. 3B along E—E of FIG. 1B and FIG. 1C. Thirty-six permanent electromagnets 24, 24, . . . are shown in FIG. 3B. An upper plate of the stage base 11 is made of a material of low permeability.

The permanent magnets 23, 23, . . . and the electromagnets 24, 24, . . . constitute a planar motor 25 of the stage apparatus 10. A motor controller 26 for controlling three axes of the planar motor 25 is connected to each electromagnet 24 of the planar motor 25.

The motor controller 26 controls the planar motor 25 so as to exert drive force in a direction (Z-direction) parallel to a line normal to the reference guide plane 11a and directions (X and Y directions) parallel to the reference guide plane 11a. These drive forces are then reliably transmitted to the table via just the upper plate of the stage base 11.

The plurality of permanent magnets 23, 23, . . . constituting the planar motor 25 are always facing one of the electromagnets 24, 24, . . . within the stage base 11 during movement in the X or Y-directions of the table 15. A holder 27 for supporting the sample 20 and moving mirrors 28x and 28y are provided at the upper surface of the table 15 at the stage apparatus 10 as shown in FIG. 1. The surface of the moving mirror 28x is a reflecting surface parallel with the YZ plane and the surface of the moving mirror 28y is a reflecting surface parallel with the XZ plane.

A laser interferometer (not shown) for projecting a beam for measuring the length of the reflecting surface of the moving mirror 28x so as to measure a position (X position) along the X-direction of the table 15 is provided at a position opposite the moving mirror 28x. A laser interferometer (not shown) is also located at a position opposite the moving mirror 28y. The position (Y-position) along the Y-direction of the table 15 can then be measured with this laser interferometer.

Results of measurements made by the laser interferometers, i.e. the X-position and Y-position of the table 15, are outputted to the motor controller 26 (refer to FIG. 3B) and used in servo control of the planar motor 25.

In addition, each one end of cables for supplying electrical power for driving a motor etc. located within the table 15, cooling fluid piping for cooling the motor, cooling fluid piping for maintaining the table 15 and sample 20 at a prescribed temperature, and cables etc. connecting to various sensors are fitted to the table 15 shown in FIG. 1A. This cabling and piping is referred to collectively as a "cable like parts 29".

Next, a description is given with reference to FIG. 1 to FIG. 3 of a positioning operation for the stage apparatus 10 configured in the above manner.

In the positioning operation, the motor controller 26 (refer to FIG. 3B) controls the planar motor 25 so as to generate a drive force in the Z-direction so as to maintain the table 15 in a state of levitation from the reference guide plane 11a. The amount (Z-position) of the levitation from the reference guide plane 11a of the table 15 can be kept fixed by balancing the drive force in the Z-direction due to the planar motor 25 and the weight of the table 15 itself.

In the positioning operation, air is continuously supplied from an air supply source (not shown) to the air pads 2A, 2B, 2C and 2D (refer to FIG. 2B, FIG. 2C and FIG. 1A). Air supplied to the air pads 2A, 2B, 2C and 2D is then jetted outwards against the reference guide plane 1a of the stage base 11. In this manner, an air layer of a prescribed pressure is formed between the moveable frame 17 and the reference guide plane 11a, i.e. the moveable frame 17 is supported in such a manner as to not make contact with the reference guide plane 11a.

The amount of levitation (Z position) from the stage base 11 of the moveable frame 17 is kept fixed by balancing the pressure of the air layer formed between the moveable frame 17 and the reference guide plane 11a and the weight of the moveable frame 17 itself. In the positioning operation, air is continuously supplied from the air supply source (not shown) to the air pads 3A, 3B, 3C and 3D.

Air supplied to the air pads 3A, 3B, 3C and 3D is blown-out toward the guide planes 18a and 19a of the moveable frame 17 so that an air layer of a prescribed pressure is formed between the table 15 and the guide planes 18a and 19a. Namely, the table 15 is supported in such a manner as to not make contact with the guide planes 18a and 19a.

At this time, the table 15 is urged towards the guide plane 19a of the Y-guide 19 by air from the air pads 3A and 3C and the Y-guide 18, and is urged towards the guide plane 18a of the Y-guide 18 by air from the air pads 3B and 3D and the Y-guide 19. In other words, the table 15 is simultaneously influenced by pressurization in the X-direction due to the opposing air pads 3A and 3B, and the opposing Y-guides 18 and 19, and by pressurization in the X-direction due to the opposing air pads 3C and 3D and the opposing Y-guides 18 and 19.

The table 15 will therefore not rotate about the Z-axis taking the center of the opening 16 of the moveable frame 17 as a center because the Y-axis is influenced at two different locations by pressurization in the X-direction, and the X-position of the table 15 with respect to the moveable frame 17 is therefore kept fixed.

In the positioning operation, air is also continuously supplied from an air supply source (not shown) to the air pads 1A, 1B, 1C and 1D (refer to FIG. 2A) and is expelled against the guide planes 13a and 14a of the X-guides 13 and 14 so that an air layer of a prescribed pressure is formed between the moveable frame 17 and the guide planes 13a and 14a. Namely, the moveable frame 17 is supported in such a manner as to not make contact with the guide planes 13a and 14a.

At this time, the moveable frame 17 is urged towards the guide plane 14a of the X-guide 14 by air from the air pads 1A and 1B and the X-guide 13 and is urged towards the guide plane 13a of the X-guide 13 by air from the air pads 1C and 1D and the X-guide 14. In other words, the moveable frame 17 is simultaneously influenced by pressurization in the Y-direction due to the opposing air pads 1A and 1C, and the opposing X-guides 13 and 14, and by pressurization in the Y-direction due to the opposing air pads 1B and 1D and the opposing X-guides 13 and 14.

The moveable frame 17 therefore does not rotate about the Z-axis within a space (hereinafter referred to as "moving space") interposed between the X-guides 13 and 14 because pressurization in the Y-direction is exerted simultaneously at two different locations on the X-axis so that the moveable frame 17 is held in a fixed position. It can therefore be said that the table 15 does not rotate about the Z-axis within the moving space because the moveable frame 17 does not rotate about the Z-axis within the moving space and because the table 15 does not rotate about the Z-axis within the opening 16 of the moveable frame 17.

One end of the cable like parts 29 shown in FIG. 1A is fitted to the table 15 but the table 15 will not rotate about the Z-axis within the moving space due to the influence of pulling or vibrating (disturbance) of the cable like parts 29.

When the motor controller 26 (refer to FIG. 3B) controls the planar motor 25 so that a drive force is generated in the Y-direction in this state, the table 15 (refer to FIG. 1A) proceeds in the Y-direction along the guide planes 18a and 19a while maintaining the state of levitation from the reference guide plane 1a and the state of non-contact with the guide planes 18a and 19a, and without rotating about the Z-axis.

At this time, the Y-position of the table 15 is controlled based on the results of measurements using the laser interferometers (not shown) located opposite each other at the moving mirror 28y (refer to FIG. 1A) and accurate positioning can therefore be achieved using the driving of the planar motor 25. Positioning in the Y-direction of the sample 20 supported at the holder 27 on the table 15 can therefore also be accurately achieved.

On the other hand, when the motor controller 26 (refer to FIG. 3B) controls the planar motor 25 so as to generate a drive force in the X-direction, the table 15 (refer to FIG. 1A) tries to move in the X-direction while maintaining a state of levitation from the reference guide plane 11a. However, because the table 15 is kept in a fixed X-position with respect to the moveable frame 17 by the aforementioned pressurization in the X-direction, the table 15 is not independent, but rather is integral with the moveable frame 17 and therefore is moved in the X-direction while being kept in a levitated state from the reference guide plane 11a.

At this time, the moveable frame 17 moves straight on in the X-direction along the guide planes 13a and 14a without rotating about the Z-axis while being held in such a manner as to not make contact with the reference guide plane 11a and the guide planes 13a and 14a. The table 15 moving integrally with the moveable frame 17 in the X-direction also moves straight on in the X-direction along the guide planes 13a and 14a without rotating about the Z-axis.

As shown in FIG. 1A, the X-position of the table 15 at this time is controlled based on the results of measurements taken by a laser interferometer (not shown) located opposite the moving mirror 28a and accurate positioning can be achieved by the driving of the planar motor 25. Positioning in the X-direction of the sample 20 supported at the holder 27 on the table 15 can therefore also be accurately achieved.

According to the first embodiment of the stage apparatus 10 provided with the X-guides 13 and 14, the Y-guides 18 and 19 and the air pads 1A to 1D and 3A to 3D, the following advantage s are obtained.

(1) The table 15 does not rotate about the Z-axis within the moving space (the space interposed between the X-guides 13 and 14) during the positioning operation even when the control system for the planar motor 25 is not used. The control system for the planar motor 25 can therefore be simplified and a three-axis control system can be adopted. When the planar motor 25 is controlled using the simplified three-system, inter-axial interference is reduced and high-precision positioning can be implemented.

(2) The moveable frame 17 has the opening 16 penetrating as far as the reference guide plane 11a and the table 15 moves along the reference guide plane 11a within this opening 16. The drive force of the planar motor 25 therefore acts directly and in a reliable manner on the vicinity of the center of gravity of the table 15 and stable movement is achieved.

The stage apparatus 10 of the first embodiment is effective if it is employed in the atmosphere. When this stage apparatus 10 is used in a vacuum or in an atmosphere of special gas, exhaust piping etc. may be provided for forcibly discharging air discharged from the air pads 1A to 1D, 2A to 2D and 3A to 3D to the outside of the chamber.

With the stage apparatus 10 the table 15 does not rotate about the Z-axis within the moving space during movement in the Y-direction of the table 15, but there is a possibility that positional shifts in the X-direction may occur. It is therefore preferable to subject the X-position of the table 15 to compensation control using the planar motor 25 in the same manner as the table 15 moves in the X-direction.

Similarly, the table 15 does not rotate about the Z-axis within the moving space during movement in the X-direction of the table 15 but there is a possibility that positional shifts in the Y-direction may occur. It is therefore also preferable to subject the Y-position of the table 15 to compensation control using the planar motor 25 in the same manner as the table 15 moves in the Y-direction.

With the magnetic-levitation type stage apparatus 10 of the first embodiment, the table 15 is caused to levitate away from the reference guide plane 11a by drive force in a Z-direction of the planar motor 25. However, as described in a following second embodiment, the table 15 can also be caused to levitate by air pads (refer to air pads 6A to 6D of FIG. 4D) provided at a bottom surface of the table 15 (a surface facing the reference guide plane 11a).

By forcibly expelling air discharged from the air pads using an exhaust channel provided about the air pads at the bottom surface of the table 15, the table 15 is urged in the direction of the reference guide plane 11a and the amount of levitation (Z-position) can be stabilized.

Second Embodiment

Next, a description is given of a second embodiment.

In a stage apparatus 30 (refer to FIG. 4 to FIG. 6) of a second embodiment, the stage apparatus 10 (refer to FIG. 1 to FIG. 3) of the first embodiment is provided with new structural elements (indicated by numerals of 4A to 4D, 5A to 5D, 6A to 6D, and 31 to 35) and the motor controller 26 (refer to FIG. 3B) is replaced with a motor controller 35.

The following description of the stage apparatus 30 of the second embodiment focuses on points of distinction with the stage apparatus 10 of the first embodiment.

With the stage apparatus 30, structural elements that are the same as those for the stage apparatus 10 (1A to 1D, 2A to 2D, 3A to 3D, 11 to 19, 21 to 25, 27 to 29) are given the same numerals.

Figure 4B:
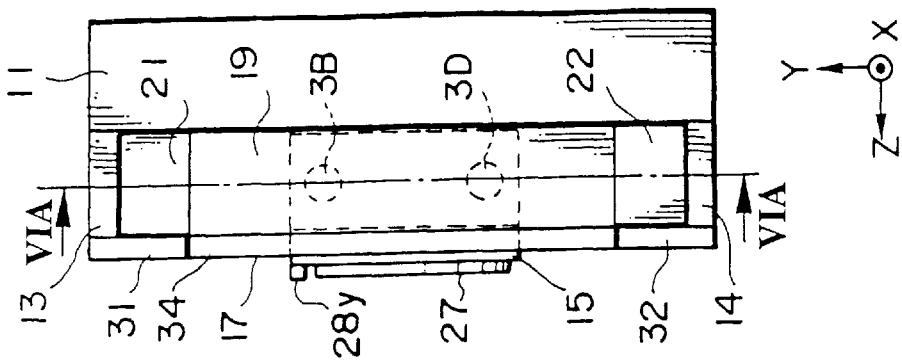
FIGS. 4B and 4C are side views of the stage apparatus 30.
Figure 4A:
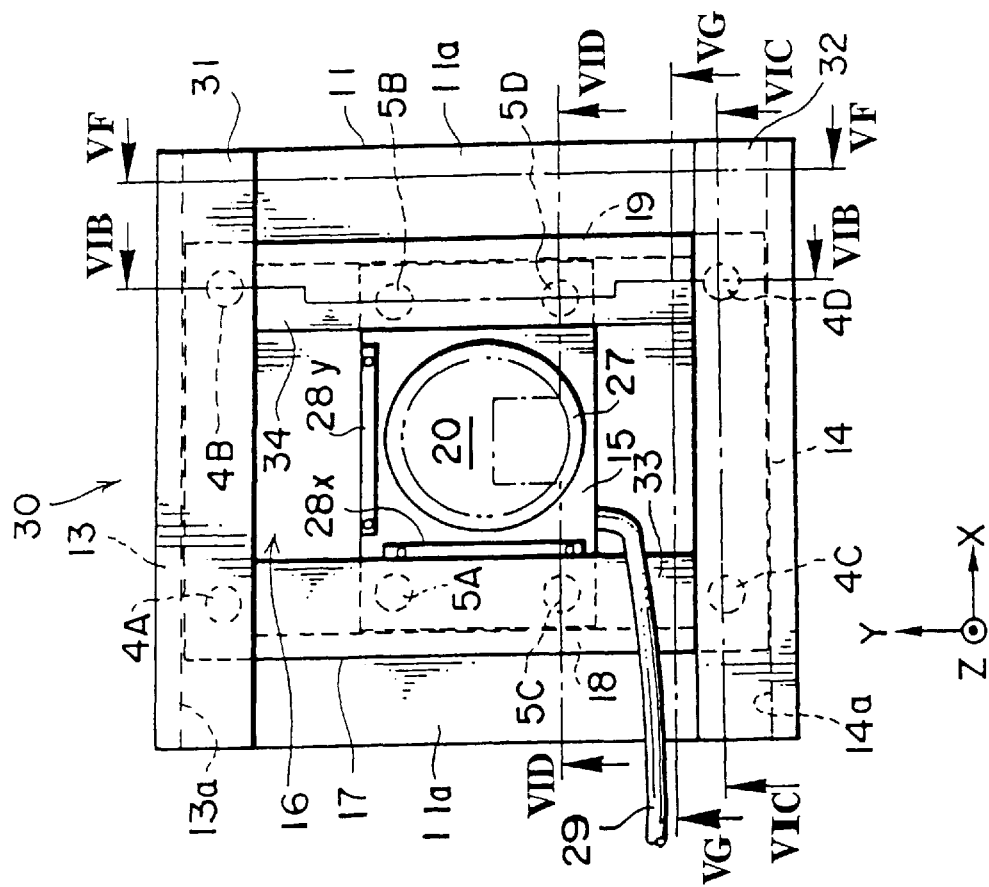
FIG. 4A is a plan view of a stage apparatus 30.
Figure 4C:
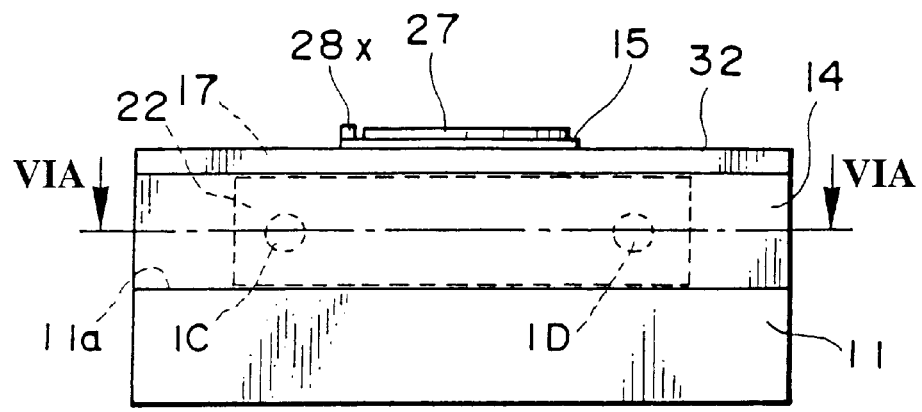
Figure 4C:
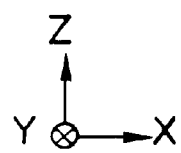

As shown in the plan view FIG. 4A and the side views FIG. 4B and FIG. 4C of the stage apparatus 30, with the stage apparatus 30 of the second embodiment, claws 31 and 32 are fixed to the upper ends of the X-guides 13 and 14. The claws 31 and 32 are for guiding the moveable frame 17 (and the table 15 positioned within the opening 16) in the X-direction together with the X-guides 13 and 14.

Figure 5A:
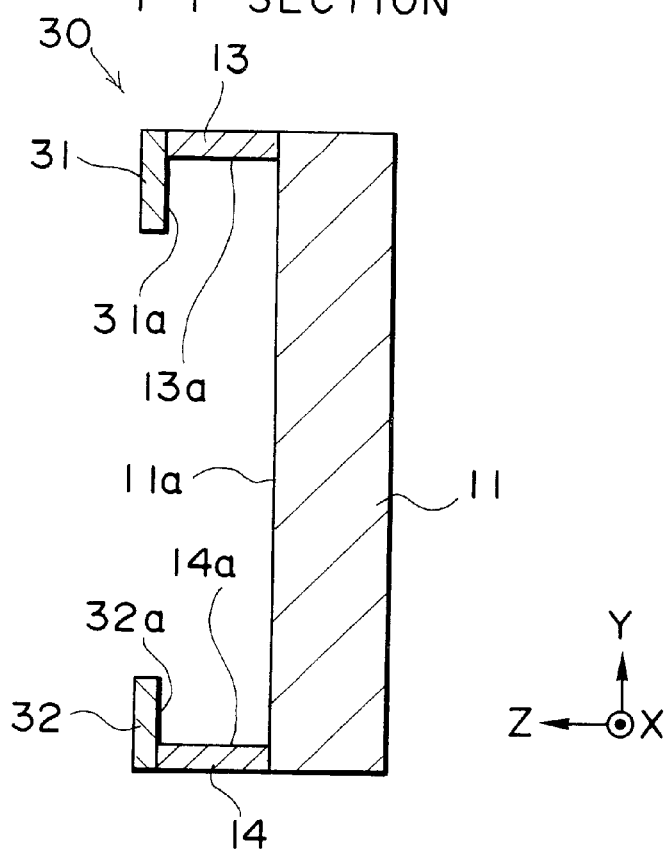
FIG. 5A is a cross-sectional view along VF—VF (hereinafter referred to as F—F) of FIG. 4A of the stage apparatus 30.

As shown in the cross-sectional view FIG. 5A taken along F—F of FIG. 4A, guide planes 31a and 32a facing the reference guide plane 11a and parallel with the reference guide plane 11a are provided at the claws 31 and 32, respectively.

Figure 6B:
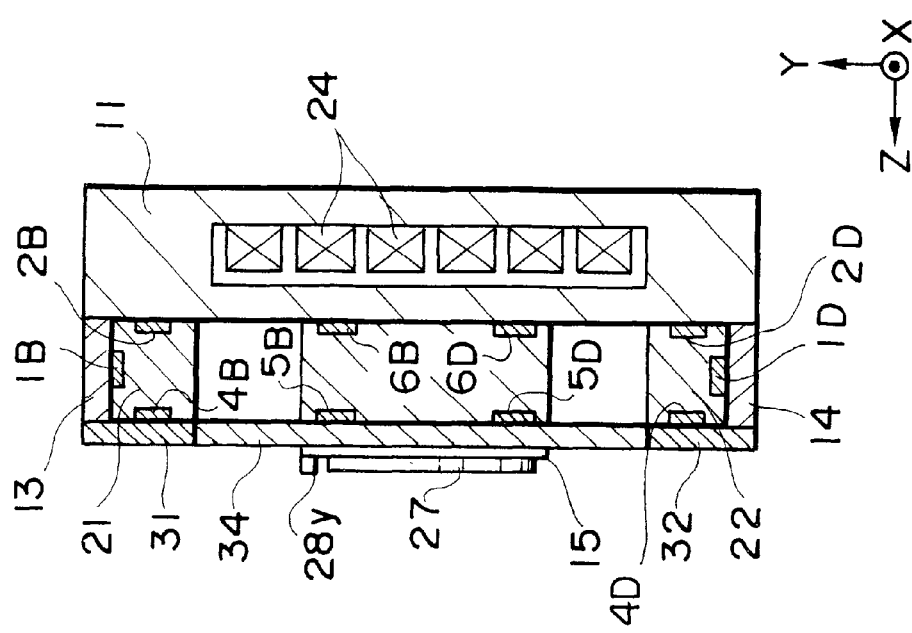
FIG. 6B is a cross-sectional view along VIB—VIB (hereinafter referred to as B—B) of FIG. 4A of the stage apparatus 30.
Figure 6A:
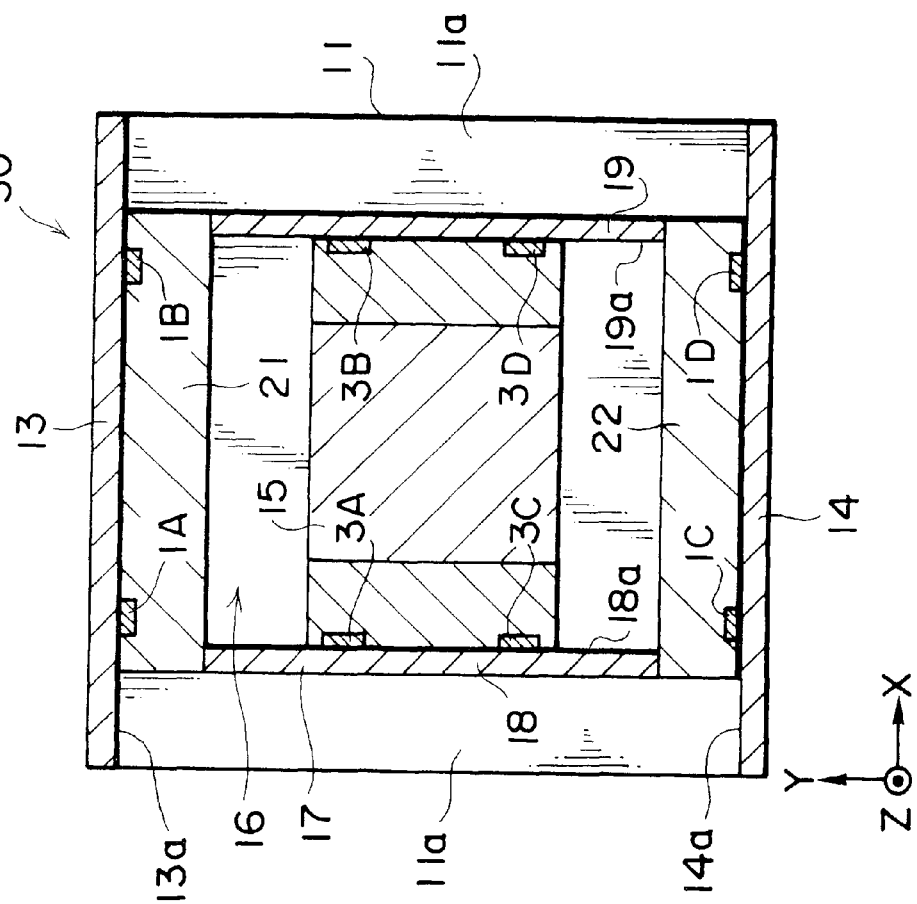
FIG. 6A is a cross-sectional view along VIA—VIA (hereinafter referred to as A—A) of FIG. 4B of the stage apparatus 30.

As shown in the cross-sectional view FIG. 6B along B—B of FIG. 4A and the cross-sectional view FIG. 6C along C—C of FIG. 4A, air pads 4A, 4B, 4C and 4D are provided at surfaces facing the guide planes 31a and 32a of the claws 31 and 32 at the coupling sections 21 and 22 of the moveable frame 17. These air pads 4A to 4D are connected to the air supply source (not shown) in the same manner as the air pads 1A to 1D, 2A to 2D and 3A to 3D.

Figure 5B:
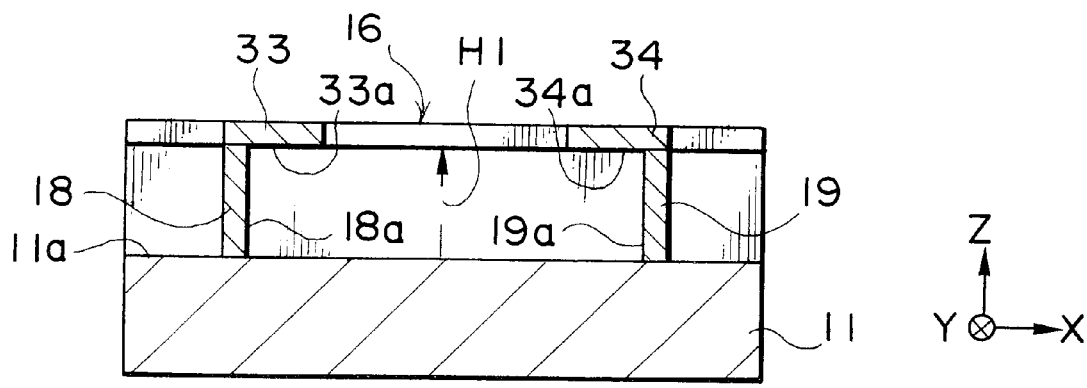
FIG. 5B is a cross-sectional view along line VG—VG (hereinafter referred to as G—G) of FIG. 4A of the stage apparatus 30.

At the stage apparatus 30, claws 33 and 34 are fixed to upper ends of the Y-guides 18 and 19 constituting the moveable frame 17, as shown in FIG. 4A and the cross-sectional view FIG. 5B along G—G of FIG. 4A. The claws 33 and 34 serve to guide the table 15 in the Y-direction together with the Y-guides 18 and 19.

Guide planes 33a and 34a facing the reference guide plane 11a and parallel with the reference guide plane 11a are provided at the claws 33 and 34, as shown in FIG. 5B.

Air pads 5A, 5B, 5C and 5D (refer to FIG. 4A) facing the guide planes 33a and 34a of the claws 33 and 34 are provided at the table 15 as shown in FIG. 6B and the cross-sectional view FIG. 6D along D—D of FIG. 4A. The air pads 5A to 5D are also connected to an air supply source (not shown).

Figure 4D:
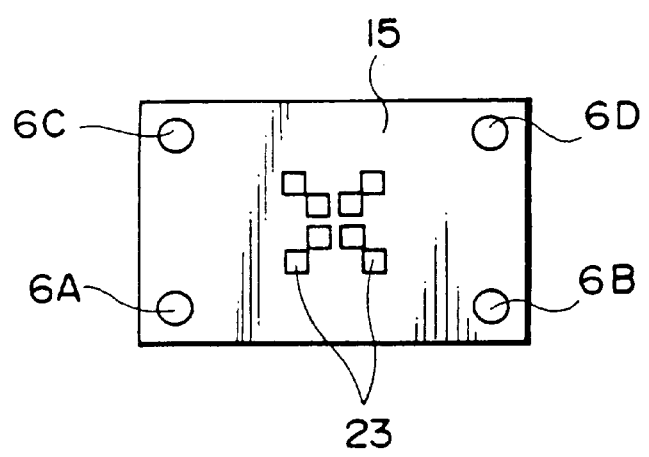
FIG. 4D is a plan view of the table 15 of the stage apparatus 30.
Figure 4D:
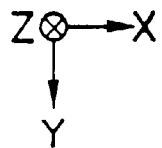

Air pads 6A, 6B, 6C and 6D are provided at surfaces facing the reference guide plane 11a at the table 15, as shown in FIG. 4D, FIG. 6B and FIG. 6D showing the table 15 from below. The air pads 6A to 6D are also connected to an air supply source (not shown).

As shown in FIG. 6D, the motor controller 35 for exerting two-axial control upon the planar motor 25 is connected to each of the electromagnets 24 constituting the planar motor 25. The motor controller 35 then controls the planar motor 25 so that drive forces are generated in directions (the X-direction and Y-direction) parallel to the reference guide plane 11a. These drive forces are then reliably transmitted to the table 15 via just the upper plate of the stage base 11.

Next, a description is given with reference to FIG. 4 to FIG. 6 of a positioning operation for the stage apparatus 30 configured in the above manner.

In this positioning operation, air is supplied continuously from the air supply source (not shown) to the air pads 1A to 1D (refer to FIG. 6A) and the moveable frame 17 is supported in such a manner as to not make contact with the guide planes 13a and 14a, as described above in the case for the stage apparatus 10. The moveable frame 17 is therefore held fixed in this Y-position without rotating about the Z-axis within the moving space (space interposed between the X-guides 13 and 14).

In this positioning operation, air is supplied continuously from the air supply source (not shown) to the air pads 3A to 3D (refer to FIG. 6A) and the table 15 is supported in such a manner as to not make contact with the guide planes 18a and 19a, as described above in the case for the stage apparatus 10. The X-position of the table 15 with respect to the moveable frame 17 is also kept fixed without rotating about the Z-axis within the moving space.

In this positioning operation, air is supplied continuously from the air supply source (not shown) to the air pads 2A to 2D (refer to FIG. 6B and FIG. 6C) and the moveable frame 17 is supported in such a manner as to not make contact with the reference guide plane 11a, as described above in the case for the stage apparatus 10.

Air is also supplied continuously from the air supply source (not shown) to the air pads 4A to 4D (refer to FIG. 6B and FIG. 6C) located opposite the air pads 2A to 2D in this positioning operation at the stage apparatus 30.

Air supplied to the air pads 4A to 4D is expelled against the guide planes 31a and 32a of the claws 31 and 32 so that an air layer of a prescribed pressure is formed between the moveable frame 17 and the guide planes 31a and 32a, i.e. the moveable frame 17 is supported in such a manner as to not make contact with the guide planes 31a and 32a.

The moveable frame 17 of the stage apparatus 30 is urged towards the reference guide plane 11a of the stage base 11 by air from the air pads 4A to 4D and the claws 31 and 32 and is urged towards the guide planes 31a and 32a of the claws 31 and 32 by air from the air pads 2A to 2D and the stage base 11.

In other words, the moveable frame 17 is simultaneously subjected to pressurization in the Z-direction due to the air pad 4A and the air pad 2A which face each other, the claw 31, and the stage base 11, pressurization in the Z-direction due to the air pad 4B and air pad 2B which face each other, the claw 31, and the stage base 11, pressurization in the Z-direction due to the air pad 4C and the air pad 2C, the claw 32, and the stage base 11, and pressurization in the Z-direction due to the air pad 4D and air pad 2D, the claw 32, and the stage base 11.

The amount of levitation (Z-position) from the reference guide plane 11a of the moveable frame 17 of the stage apparatus 30 is therefore strictly defined as a result of the moveable frame 17 of the stage apparatus 30 being subjected to pressurization in the Z-direction simultaneously at four different locations within the XY plane. As shown in 5B, the guide planes 33a and 34a of the claws 33 and 34 fixed to the Y-guides 18 and 19 of the moveable frame 17 are therefore strictly defined at a height H1 from the reference guide plane 11a.

In the positioning operation, air is also continuously supplied from an air supply source (not shown) to the air pads 6A to 6D (refer to FIG. 6B and FIG. 6D) and is expelled at the reference guide plane 11a of the stage base 11. As a result, an air layer of a prescribed pressure is formed between the table and the reference guide plane 11a, i.e. the table 15 is supported in a levitated state from the reference guide plane 11a.

In the positioning operation, air is also continuously supplied from an air supply source (not shown) to the air pads 5A to 5D (refer to FIG. 6B and FIG. 6D) and is expelled at the guide planes 33a and 34a of the claws 33 and 34. In this way, an air layer of a prescribed pressure is formed between the table and the guide planes 33a and 34a, i.e. the table 15 is supported in such a manner as to not make contact with the guide planes 33a and 34a.

The table 15 of the stage apparatus 30 is urged towards the reference guide plane 11a of the stage base 11 by air from the air pads 5A to 5D and the claws 33 and 34 and is urged towards the guide planes 33a and 34a of the claws 33 and 34 by air from the air pads 6A to 6D and the stage base 11.

In other words, the table 15 is simultaneously subjected to pressurization in the Z-direction due to the air pad 5A and the air pad 6A which face each other, the claw 33, and the stage base 11, pressurization in the Z-direction due to the air pad 5B and air pad 6B which face each other, the claw 34, and the stage base 11, pressurization in the Z-direction due to the air pad 5C and the air pad 6C, the claw 33, and the stage base 11, and pressurization in the Z-direction due to the air pad 5D and air pad 6D, the claw 34, and the stage base 11.

Because the height H1 (refer to FIG. 5B) of the guide planes 33a and 34a of the claws 33 and 34 is fixed as mentioned before, the table 15 of the stage apparatus 30 is subjected to pressurization in the Z-direction simultaneously at four different locations within the XY plane and the amount of the levitation (Z position) from the reference guide plane 11a is therefore strictly defined.

When the motor controller 35 (refer to FIG. 6D) controls the planar motor 25 so that a drive force is generated in the Y-direction in this state, the table 15 (refer to FIG. 4A) proceeds in the Y-direction while maintaining the state of levitation from the reference guide plane 11a and the state of non-contact with the guide planes 18a and 19a and the guide planes 33a and 34a, and without rotating about the Z-axis within the opening 16 of the moveable frame 17.

At this time, the Y-position of the table 15 can be controlled so as to be precisely positioned based on the results of measurements of the laser interferometers (not shown) arranged facing each other at the moving mirror 28y (refer to FIG. 4A), as with the stage apparatus 10. Positioning in the Y-direction of the sample 20 on the table 15 can therefore also be accurately achieved.

On the other hand, when the motor controller 35 (refer to FIG. 6D) controls the planar motor 25 so as to generate a drive force in the X-direction, the table 15 (refer to FIG. 4A) moves in the X-direction integrally with the moveable frame 17 while maintaining a state of levitation from the reference guide plane 11a and while not coming into contact with the guide planes 33a and 34a.

At this time, the moveable frame 17 therefore proceeds directly in the X-direction while maintaining a state of non-contact with the reference guide plane 11a, guide planes 13a and 14a, and guide planes 31a and 32a and without rotating about the Z-axis or moving up or down. The table 15 moving in the X-direction integrally with the moveable frame 17 also moves straight on in the X-direction without rotating about the Z-axis or moving up or down.

At this time, the X-position of the table 15 can be controlled so as to be precisely positioned based on the results of measurements of the laser interferometers (not shown) arranged facing each other at the moving mirror 28x (refer to FIG. 4A), as with the stage apparatus 10. Positioning in the X-direction of the sample 20 on the table 15 can therefore also be accurately achieved.

According to the stage apparatus 30 of the second embodiment provided with the claws 31 to 34 and the air pads 4A to 4D and 5A to 5D, the table 15 can be smoothly moved without up or down movement during the positioning operation. Bearing rigidity can therefore be increased without increasing the weight of the table 15.

When the weight of the table 15 is increased, the force of inertia of the table 15 will increase and this impedes increases in the speed of driving. It is also difficult to improve positioning precision due to the influence of vibrations becoming more predominant as the weight of the table 15 increases. The load of the planar motor 25 therefore increases and making the stage apparatus 30 lighter in weight and smaller is difficult.

However, with the stage apparatus 30 of the second embodiment, it is possible to reduce the load on the planar motor 25 and increase positioning speed and precision while making the stage apparatus 30 still lighter in weight and smaller in size because bearing stiffness can be increased without increasing the weight of the table 15. Further, the control system for the planar motor 25 can be further simplified and a two-axial control system can be adopted with the stage apparatus 30 of the second embodiment by adopting a configuration where the air pads 6A to 6D are provided at the lower surface of the table 15 so as to provide levitation from the reference guide plane 11a.

When the planar motor 25 is controlled using the simplified two-axis control system, inter-axial interference is reduced and high-precision positioning can be implemented.

The stage apparatus 30 of the second embodiment is effective if it is employed in the atmosphere. When this stage apparatus 30 is used in a vacuum or in an atmosphere of special gas, exhaust piping etc. may be provided for forcibly discharging air discharged from the air pads 1A to 1D, 2A to 2D, 3A to 3D, 4A to 4D, 5A to 5D and 6A to 6D to outside of the chamber.

Third Embodiment

Next, a description is given of a third embodiment.

In a stage apparatus 40 (refer to FIG. 7 to FIG. 9) of the third embodiment, the X-guides 13 and 14 and the claws 31 and 32 constituting the stage apparatus 30 (refer to FIG. 4 to FIG. 6) of the second embodiment are replaced with X-guides 41 and 42, the air pads 1A to 1D and 4A to 4D are replaced with air pads 7A to 7D, the Y-guides 18 and 19 and claws 33 and 34 are replaced with Y-guides 43 and 44, and the air pads 3A to 3D and 5A to 5D are replaced with air pads 8A to 8D.

The following description of the stage apparatus 40 of the third embodiment focuses on points of distinction with the stage apparatus 30 of the second embodiment.

Figure 7C:
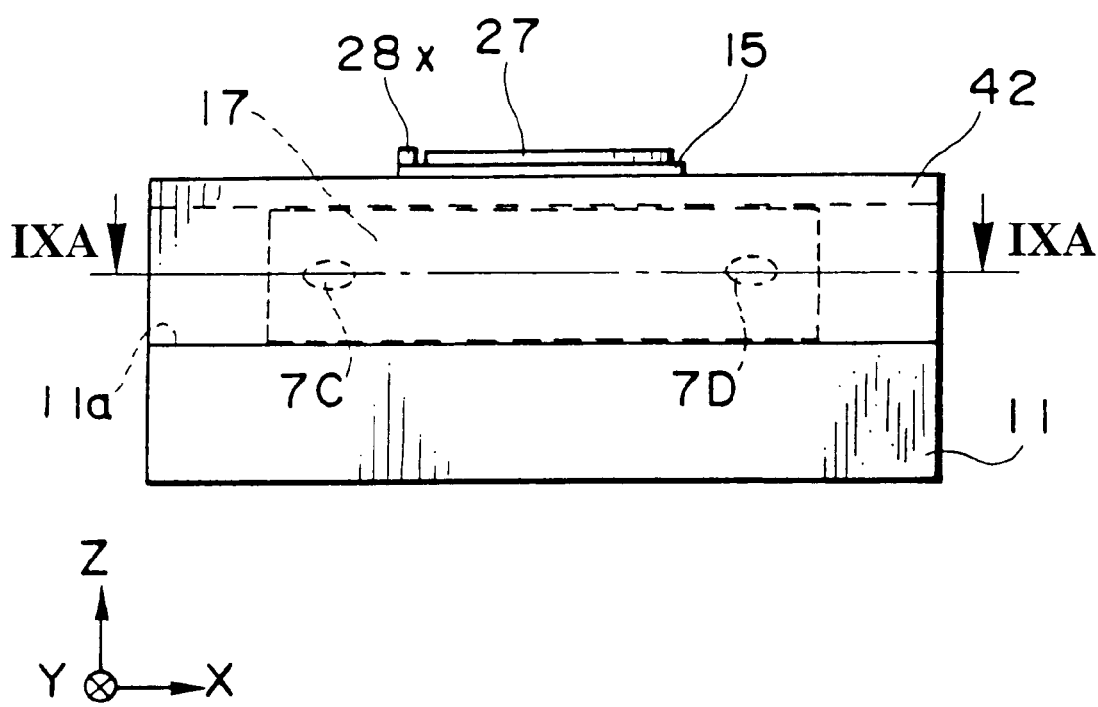
Figure 8A:
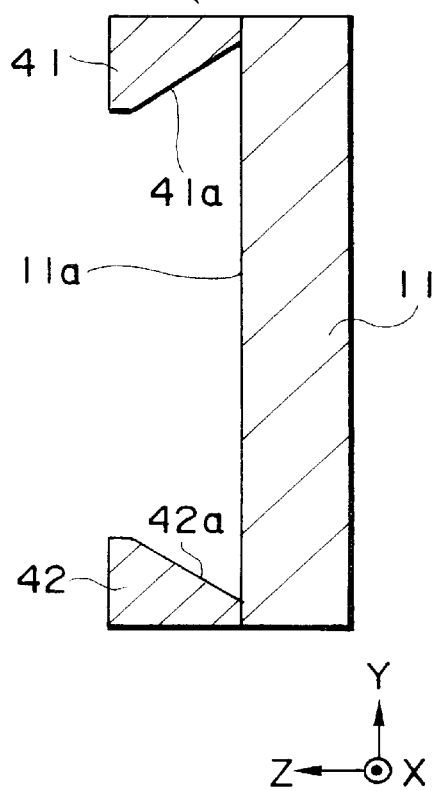
FIG. 8A is a cross-sectional view along VIIIF—VIIIF (hereinafter referred to as F—F) of FIG. 7A of the stage apparatus 40.
Figure 8B:
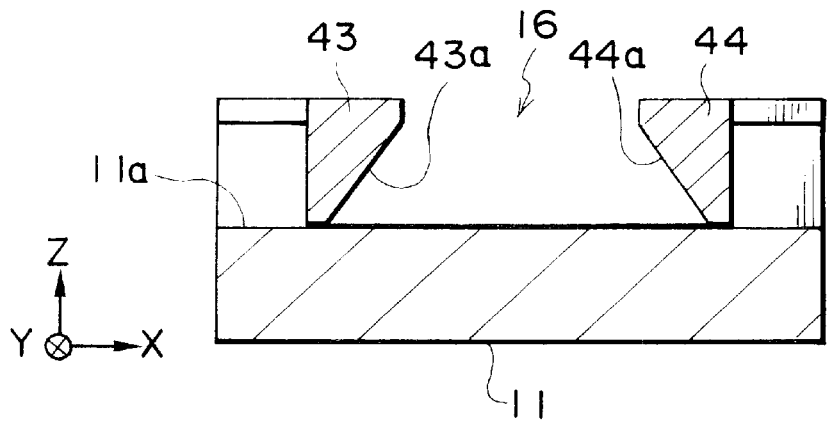
FIG. 8B is a cross-sectional view along VIIIG—VIIIG (hereinafter referred to as G—G) of FIG. 7A of the stage apparatus 40.
Figure 9C:
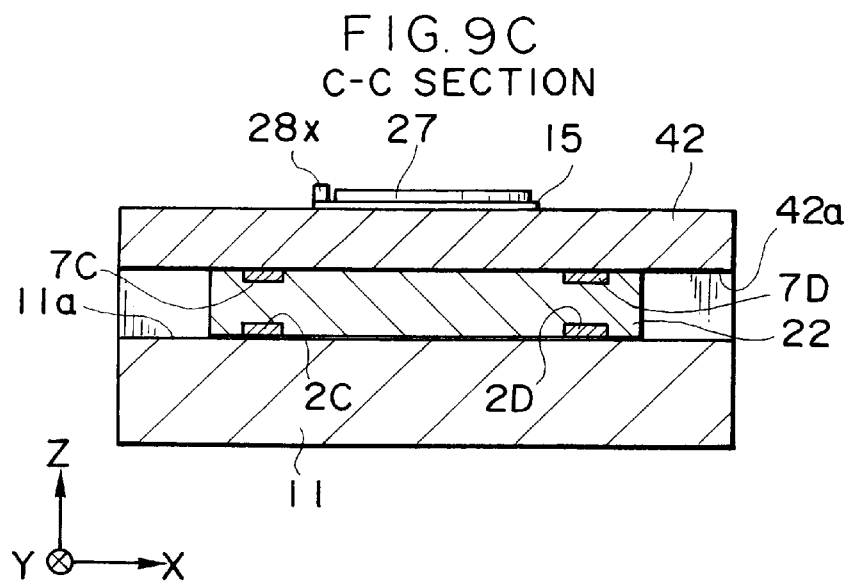
FIG. 9C is a cross-sectional view along IXC—IXC (hereinafter referred to as C—C) of FIG. 7A of the stage apparatus 40 and FIG. 9D is a cross-sectional view along IXD—IXD (hereinafter referred to as D—D) of FIG. 7A of the stage apparatus 40.
Figure 9D:
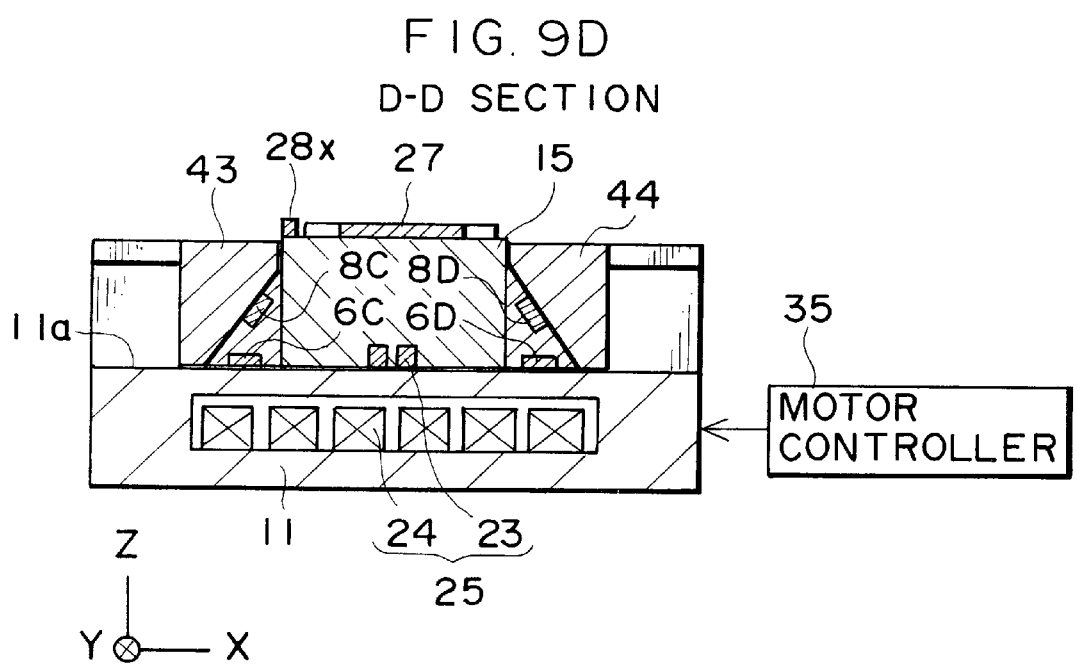

FIG. 7A, FIG. 7B and FIG. 7C show a plan view and side views, respectively, of the stage apparatus 40 of the third embodiment. FIG. 8A and FIG. 8B show a cross-sectional view along F—F of FIG. 7A and along G—G of FIG. 7A, respectively. Further, FIG. 9A shows a cross-sectional view along A—A of FIG. 7B and FIG. 7C. FIG. 9B to 9D show cross-sectional views along B—B, along C—C, and along D—D of FIG. 7A, respectively.

With the stage apparatus 40, structural elements (2A to 2D, 6A to 6D, 11, 12, 15 to 17, 21 to 25, 27 to 29) that perform the same function as those for the stage apparatus 30 are given the same numerals.

The X-guides 41 and 42 of the stage apparatus 40 are fixed at the side of the reference guide plane 11a of the stage base 11.

As shown in FIG. 8A, inclined guide planes 41a and 42a that are not parallel with respect to the reference guide plane 11a are provided at the X-guides 41 and 42. The inclined guide planes 41a and 42a face each other and face the reference guide plane 11a.

As shown in FIG. 9A and FIG. 9B, air pads 7A, 7B, 7C and 7D of the stage apparatus 40 are provided at the surfaces of the coupling sections 21 and 22 facing the inclined guide planes 41a and 42a of the X-guides 41 and 42 (also refer to FIG. 7A). The air pads 7A to 7D are also connected to an air supply source (not shown) as with the air pads 2A to 2D and 6A to 6D.

The Y-guides 43 and 44 of the stage apparatus 40 are coupled by the coupling sections 21 and 22 and constitute the moveable frame 17 having the opening 16. As shown in FIG. 8B, inclined guide planes 43a and 44a that are not parallel with respect to the reference guide plane 11a are provided at the Y-guides 43 and 44. The inclined guide planes 43a and 44a face each other and face the reference guide plane 11a.

As shown in FIG. 9A and FIG. 9D, air pads 8A, 8B, 8C and 8D of the stage apparatus 40 are provided at the surface of the table 15 facing the inclined guide planes 43a and 44a of the Y-guides 43 and 44 (also refer to FIG. 7A). The air pads 8A to 8D are connected to an air supply source (not shown).

Next, a description is given of a positioning operation for the stage apparatus 40 configured in the above manner.

When air is supplied to the air pads 2A to 2D and the air pads 6A to 6D, the moveable frame 17 is supported so as not to make contact with the reference guide plane 11a and the table 15 is kept in a state of levitation from the reference guide plane 11a, as in the case for the stage apparatus 30.

Air supplied to the air pads 7A to 7D is expelled against the inclined guide planes 41a and 42a of the X-guides 41 and 42 and an air layer of a prescribed pressure is formed between the moveable frame 17 and the inclined guide planes 41a and 42a. As a result, the moveable frame 17 is maintained in a state of non-contact from the inclined guide planes 41a and 42a.

Air supplied to the air pads 8A to 8D is expelled against the inclined guide planes 43a and 44a of the Y-guides 43 and 44 and an air layer of a prescribed pressure is formed between the table 15 and the inclined guide planes 43a and 44a. As a result, the table 15 is supported away from the inclined guide planes 43a and 44a so as to not make contact with the inclined guide planes 43a and 44a.

As a result of the pressure of the air layer formed with the inclined guide plane 41a of the X-guide 41 and with the inclined guide plane 42a of the X-guide 42, the moveable frame 17 is urged towards the inclined guide planes 41a and 42a and is urged towards the reference guide plane 11a of the stage base 11.

The Y-position for the moveable frame 17 is therefore kept fixed without any rotation about the Z-axis within a space interposed between the X-guides 41 and 42 and the amount of levitation (Z-position) from the reference guide plane 11a can be precisely defined.

On the other hand, as with the moveable frame 17, the table 15 is also urged towards the inclined guide planes 43a and 44a and is urged towards the reference guide plane 11a of the stage base 11 as a result of the pressure of air layers formed with the inclined guide plane 43a of the Y-guide 43 and the inclined guide plane 44a of the Y-guide 44.

As with the stage apparatus 30, the X-position of the table with respect to the moveable frame 17 is also kept fixed without rotation about the Z-axis within a space interposed between the X-guides 41 and 42 and the amount of levitation (Z-position) from the reference guide plane 11a can be strictly defined.

When, in this state, the motor controller 35 (refer to FIG. 9D) controls the planar motor 25 so as to generate drive force in the X-direction and/or Y-direction, as in the aforementioned embodiments, the moveable frame 17 and the table 15 move and precise positioning of the sample 20 on the table 15 in the X and Y-directions can be achieved.

According to the stage apparatus 40 of the third embodiment provided with the X-guides 41 and 42, the Y-guides 43 and 44, the air pads 7A to 7D and the air pads 8A to 8D, the table 15 can be smoothly moved without up or down movement during the positioning operation.

With the stage apparatus 40 of the third embodiment, the function of the X-guides 13 and 14, claws 31 and 32, air pads 1A to 1D and air pads 4A to 4D of the stage apparatus 30 is served by the X-guides 41 and 42 and the air pads 7A to 7D, and the function of the Y-guides 18 and 19, claws 33 and 34, air pads 3A to 3D, and air pads 5A to 5D is served by the Y-guides 43 and 44 and the air pads 5A to 8D, and the number of parts can therefore be reduced.

Fourth Embodiment

Next, a description is given of a fourth embodiment.

With a stage apparatus 50 (refer to FIG. 10 and FIG. 11) of the fourth embodiment, L-shaped Y-guides 51 and 52 are provided in place of the flat Y-guides 18 and 19 constituting the stage apparatus 30 (refer to FIG. 4 to FIG. 6) of the second embodiment, and air pads 9A to 9D are provided in place of the air pads 6A to 6D.

The following description of the stage apparatus 50 of the fourth embodiment focuses on points of distinction with the stage apparatus 30 of the second embodiment.

Figure 10C:
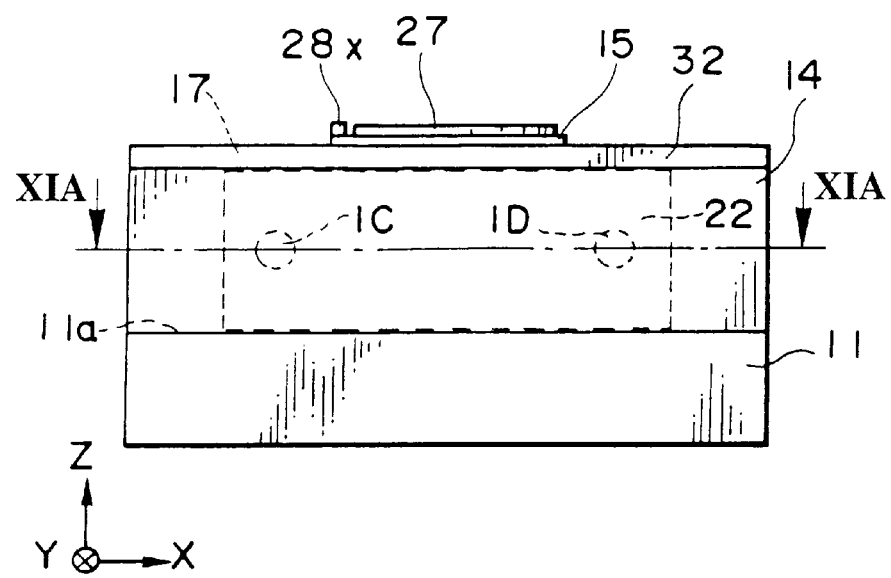

FIGS. 10A to 10D show a plan view and side views of the stage apparatus 50 of the fourth embodiment, and a view from below of the table 15, respectively. Further, FIG. 11A shows a cross-sectional view along A—A of FIG. 10B and FIG. 10C, FIG. 11B to FIG. 11d show a cross-sectional view along B—B, along G—G, and along D—D of FIG. 10A, respectively. A cross-sectional view along C—C of FIG. 10A is the same as the aforementioned FIG. 6 and is omitted from the drawings.

With the stage apparatus 50 (refer to FIG. 10A to FIG. 11D), structural elements (1A to 1D, 2A to 2D, 3A to 3D, 4A to 4D, 5A to 5D, 11 to 17, 21 to 25, 27 to 29, 31 to 35) that perform the same function as those for the stage apparatus 30 (refer to FIG. 4 to FIG. 6) are given the same numerals.

The Y-guides 51 and 52 of the stage apparatus 50 are coupled by the coupling sections 21 and 22 as shown in FIG. 11A and constitute the moveable frame 17 having the opening 16. The claws 33 and 34 are fixed to the upper end of the Y-guides 51 and 52, respectively.

As shown in FIG. 11C, guide planes 51a and 52a parallel with the YZ plane and facing each other, guide planes 51b and 52b facing and being parallel with the guide planes 33a and 34a of the claws 33 and 34, and guide planes 51c and 51d parallel with the YZ plane and facing each other are provided at the Y-guides 51 and 52. The guide planes 51c and 51d are positioned more towards the side of the reference guide plane 11a than the guide planes 51a and 52a. A space between the guide planes 51c and 52c is narrower than a space between the guide planes 51a and 52a. The length in the Z-direction of the guide planes 51a and 52a is longer than the length in the Z-direction of the guide planes 51c and 52c.

The moveable frame 17 of the stage apparatus 50 therefore comprises a channel-shaped recess extending in the Y-direction and formed of the claw 33 and the Y-guide 51, and a channel-shaped recess extending along the Y-direction and formed of the claw 34 and the Y-guide 52, with these recesses facing each other. The cross-sectional shape of the table 15 therefore forms a cross-shape along the guide planes 33a and 34a of the claws 33 and 34 and along the guide planes 51a, 52a, 51b, 52b, 51c and 52c of the Y-guides 51 and 52 so as to loosely fit within the channel-shaped recess of the moveable frame 17 (refer to FIG. 1D).

A lower surface 15a of the table 15 faces the reference guide plane 11a of the stage base 11 and a plurality of permanent magnets 23, 23, . . . (refer to FIG. 10D) constituting the planar motor 25 are provided at the lower surface 15a of the table 15.

Figure 10D:
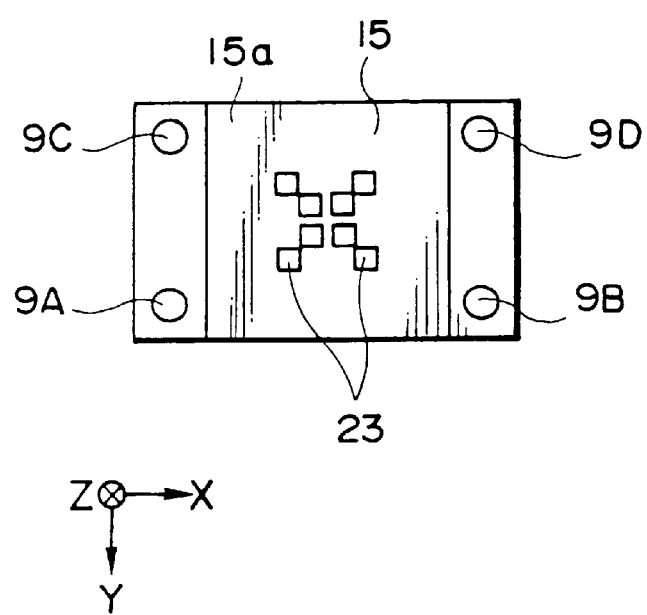
FIG. 10D is a plan view of the table 15 of the stage apparatus 50.
Figure 11C:
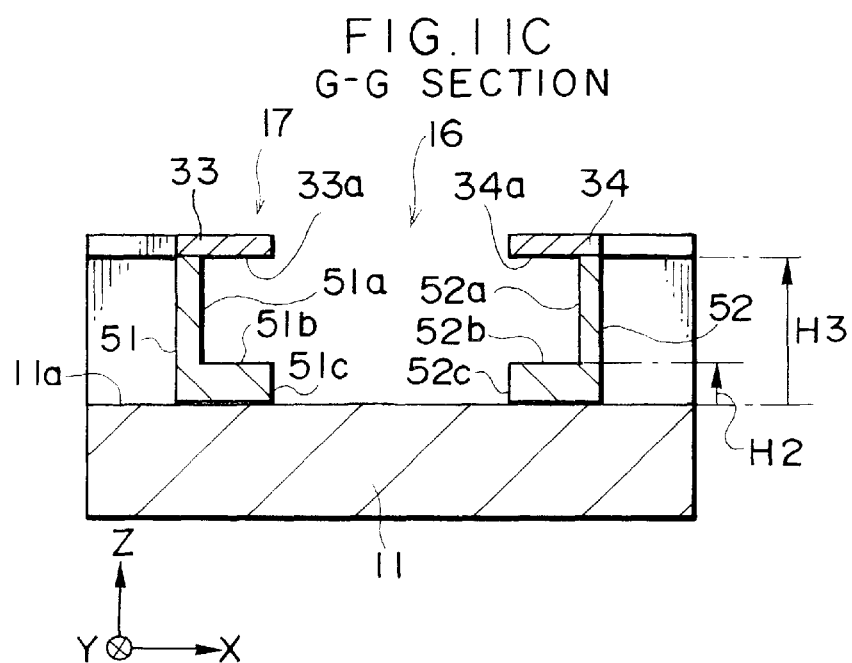
FIG. 11C is a cross-sectional view along XIC—XIC (hereinafter referred to as C—C) of FIG. 10A of the stage apparatus 50.
Figure 11D:
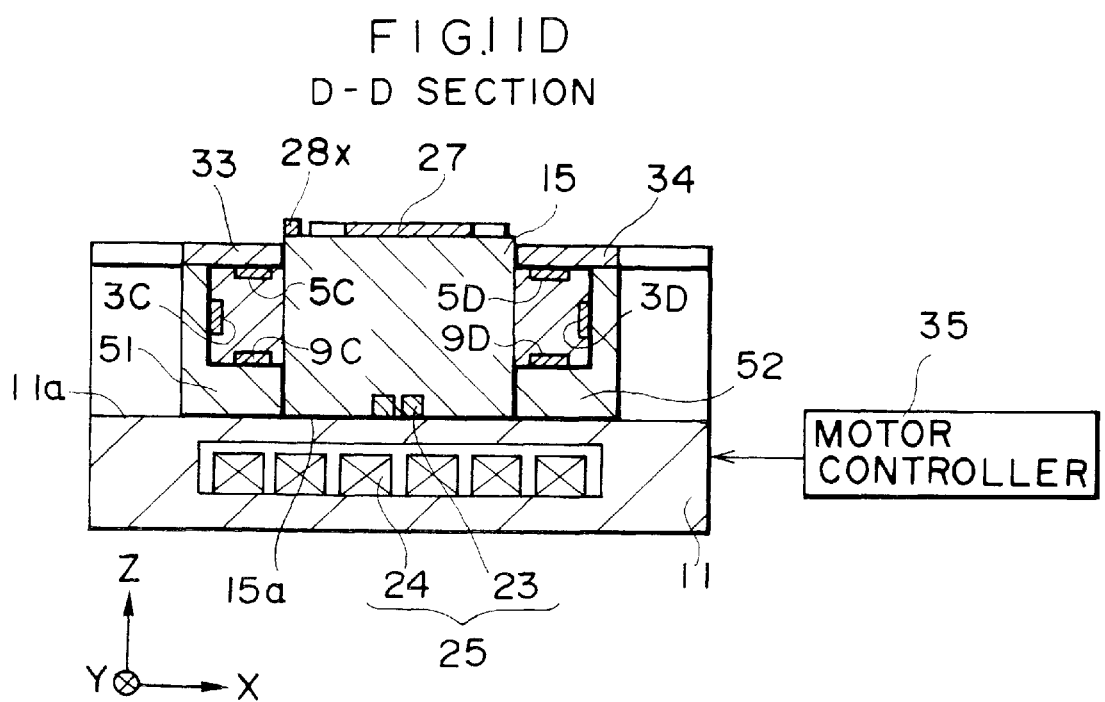
FIG. 11D is a cross-sectional view along XID—XID (hereinafter referred to as D—D of FIG. 10A of the stage apparatus 50.

As shown in FIG. 11B and FIG. 11D, air pads 9A, 9B, 9C and 9D of the stage apparatus 50 are provided at the surface of the table 15 facing the guide planes 51b and 52b of the Y-guides 51 and 52 (also refer to FIG. 10D). The air pads 9A to 9D are also connected to an air supply source (not shown).

At the stage apparatus 50, the air pads 3A to 3D are provided at the surface of the table 15 facing the guide planes 51a and 52a of the Y-guides 51 and 52, as shown in FIG. 11A and FIG. 11D.

Next, a description is given of a positioning operation for the stage apparatus 50 configured in the above manner.

When air is supplied to the air pads 1A to 1D, 2A to 2D and 4A to 4D, the moveable frame 17 is supported in such a manner as to not make contact with the guide planes 13a, 14a, 31a and 32a (refer to FIG. 5A) and the reference guide plane 11a. This is the same as the case for the stage apparatus 30. Heights H2 and H3 from the reference guide plane 11a can therefore be precisely defined with the guide planes 51b and 52b of the Y-guides 51 and 52 (refer to FIG. 11C) constituting the moveable frame 17 and the guide planes 33a and 34a of the claws 33 and 34 fixed to the Y-guides 51 and 52.

The table 15 is supported in such a manner as to not make contact with the guide planes 51a and 52a as a result of an air layer of a prescribed pressure being formed at the guide planes 51a and 52a of the Y-guides 51 and 52 by air provided to the air pads 3A to 3D. The X-position of the table 15 of the stage apparatus 50 with respect to the moveable frame 17 is also kept fixed without rotating about the Z-axis within the moving space, as in the case for the stage apparatus 30.

When air is supplied to the air pads 5A to 5D, the table 15 is supported in such a manner as to not make contact with the guide planes 33a and 34a of the claws 33 and 34, as in the case for the stage apparatus 30. The table 15 is supported in such a manner as to not make contact with the guide planes 51b and 52b and be kept levitated away from the reference guide plane 11a as a result of an air layer of a prescribed pressure being formed between the table 15 and the guide planes 51b and 52b of the Y-guides 51 and 52 by air provided to the air pads 9A to 9D.

The table 15 of the stage apparatus 50 is urged towards the guide planes 51b and 52b of the Y-guides 51 and 52 and reference guide plane 11a of the stage base 11 by air from the air pads 5A to 5D and the claws 33 and 34, and is urged towards the guide planes 33a and 34a of the claws 33 and 34 by air from the air pads 9A to 9D and the Y-guides 51 and 52.

In other words, the table 15 is simultaneously subjected to pressurization in the Z-direction due to the air pad 5A and the air pad 9A which face each other, the claw 33, and the Y-guide 51, pressurization in the Z-direction due to the air pad 5B and air pad 9B which face each other, the claw 34, and the Y-guide 52, pressurization in the Z-direction due to the air pad 5C and the air pad 9C, the claw 33, and the Y-guide 51, and pressurization in the Z-direction due to the air pad 5D and air pad 9D, the claw 34, and the Y-guide 52.

Because the height H2 of the guide planes 51b and 52b of the Y-guides 51 and 52 and the height H3 (refer to FIG. 1C) of the guide planes 33a and 34a of the claws 33 and 34 are fixed, the table 15 of the stage apparatus 50 is subjected to pressurization in the Z-direction simultaneously at four different locations within the XY plane and the amount of the levitation (Z position) from the guide planes 51b and 52b and the reference guide plane 11a is therefore strictly defined.

When, in this state, the motor controller 35 (refer to FIG. 11D) controls the planar motor 25 so as to generate drive force in the X-direction and/or Y-direction, as in the aforementioned embodiments, the moveable frame 17 and the table 15 move and precise positioning of the sample 20 on the table 15 in the X and Y-directions can be achieved.

Figure 12A:
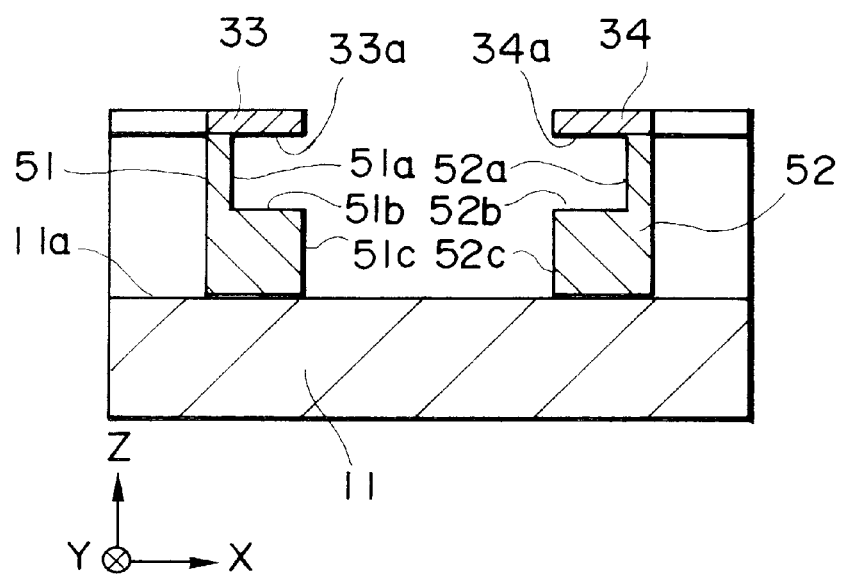
FIGS. 12A and 12B are cross-sectional views showing a modified configuration for the stage apparatus 50.
Figure 12B:
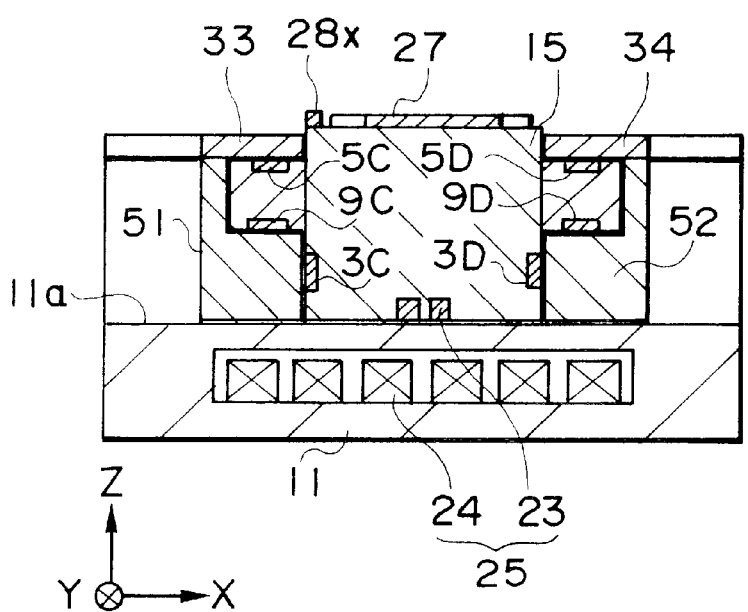

According to the stage apparatus 50 of the fourth embodiment provided with the Y-guides 51 and 52 and the air pads 9A to 9D, the table 15 can be smoothly moved without up or down movement during the positioning operation. At the stage apparatus 50 of the fourth embodiment, the air pads 3A to 3D are provided at the surface of the table 15 facing the guide planes 51a and 52a of the Y-guides 51 and 52 (refer to FIG. 11D) but the air pads 3A to 3D may also be fitted at the surface of the table 15 facing the guide planes 51c and 51d of the Y-guides 51 and 52, as shown in FIG. 12A and FIG. 12B. At this time the length in the Z-direction of the guide planes 51c and 52c may preferably be longer than the length in the Z-direction of the guide planes 51a and 52a.

FIG. 12A corresponds to the cross-sectional view along G—G of FIG. 10A, as with the cross-sectional view shown in FIG. 11C. FIG. 12B corresponds to the cross-sectional view along D—D of FIG. 10A, as with the cross-sectional view shown in FIG. 11D.

In the fourth embodiment, a description is given of the stage apparatus 50 configured in such a manner that lower ends of the L-shaped Y-guides 51 and 52 enter between the table 15 and the reference guide plane 11a (a modification of the stage apparatus 30 of the second embodiment). However, the lower ends of the Y-guides 43 and 44 of the stage apparatus 40 (refer to FIG. 7 to FIG. 9) of the third embodiment can also be similarly modified in such a manner that the lower ends of the Y-guides 43 and 44 enter between the table 15 and the reference guide plane 11a. In case, the air pads 9A to 9D may also be similarly provided in place of the air pads 6A to 6D.

In the second to fourth embodiments, air pads (refer to the air pads 6A to 6D of FIG. 4D) are provided at the lower surface (the surface facing the reference guide plane 11a) of the table 15 or air pads (refer to the air pads 9A to 9D of FIG. 10D) are provided at a surface facing the guide planes 51b and 52b of the table 15 in order to levitate the table 15 away from the reference guide plane 11a. However, the table 15 can also be levitated away from the reference guide plane 11a by controlling the planar motor 25 so as to generate a drive force in the Z-direction. In case, the air pads 6A to 6D (refer to FIG. 4D) and the air pads 9A to 9D (refer to FIG. 10D) provided at the table 15 are no longer necessary.

Fifth Embodiment

Next, a description is given of a fifth embodiment.

With a stage apparatus 60 (refer to FIG. 13A to FIG. 14D) of the fifth embodiment, a base plate 61 is fitted to the moveable frame 17 constituting the stage apparatus 30 of the second embodiment, and air pads 10A to 10D are provided in place of the air pads 6A to 6D.

The following description of the stage apparatus 60 of the fifth embodiment focuses on points of distinction with the stage apparatus 30 of the second embodiment.

FIGS. 13A to 13D show a plan view and side views of the stage apparatus 60 of the fifth embodiment, and a view from below of the table 15, respectively. Further, FIG. 14A to FIG. 14D show a cross-sectional view along A—A of FIG. 13B and FIG. 13C, a cross-sectional view along B—B, along C—C, and along D—D of FIG. 13A, respectively.

With the stage apparatus 60 (refer to FIG. 13A to FIG. 14D), structural elements (1A to 1D, 2A to 2D, 3A to 3D, 4A to 4D, 5A to 5D, 11 to 19, 21 to 25, 27 to 29, 31 to 35) that perform the same function as those for the stage apparatus 30 (refer to FIG. 4A to FIG. 4D) are given the same numerals.

Figure 13B:
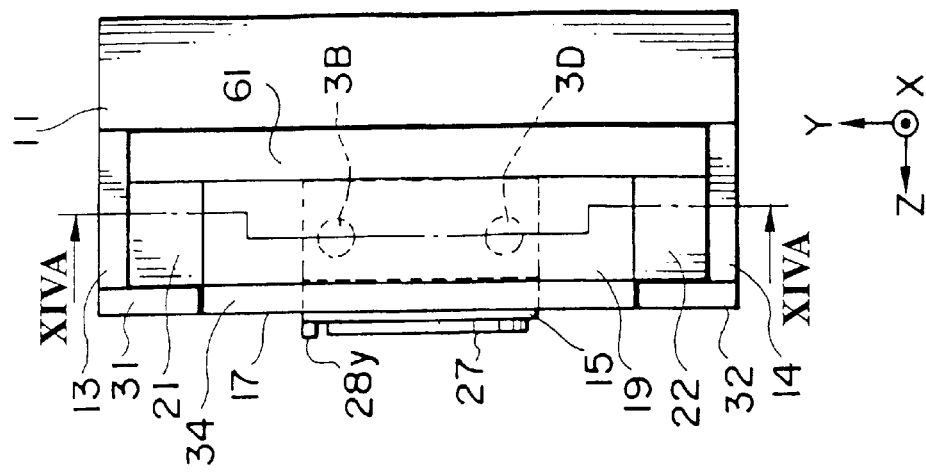
Figure 13A:
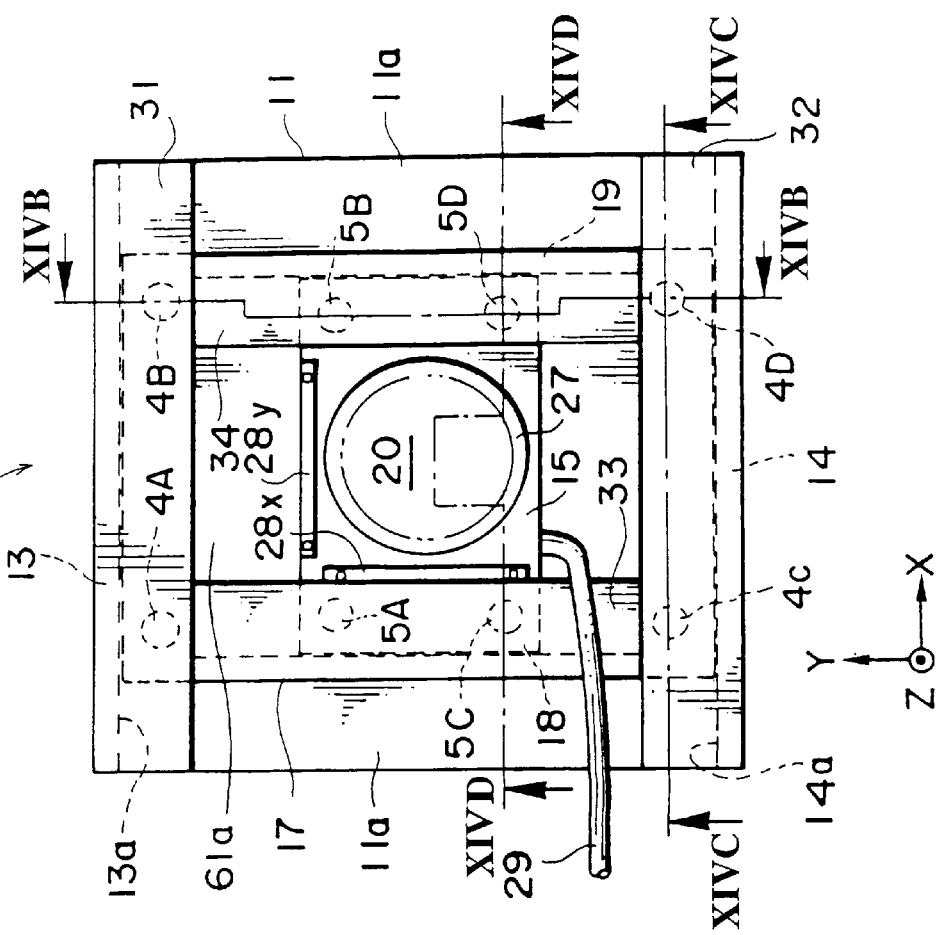
FIG. 13A is a plan view of a stage apparatus 60.
Figure 14C:
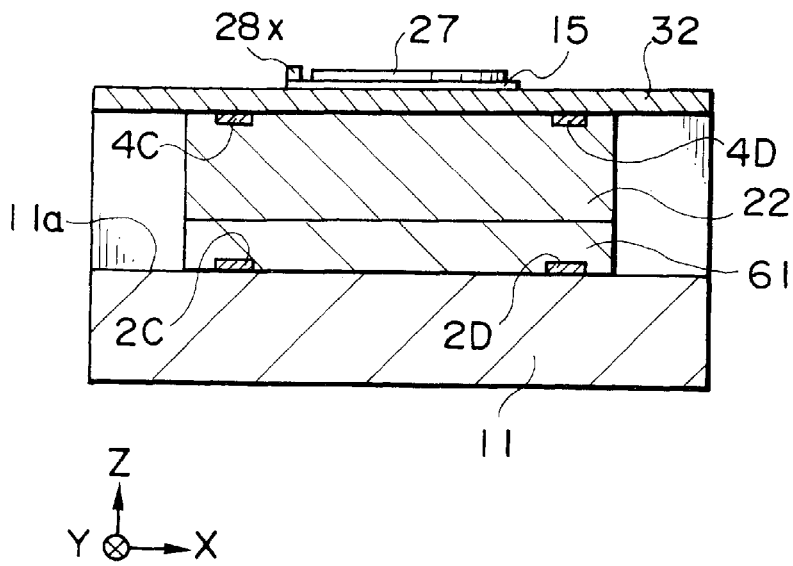
FIG. 14C is a cross-sectional view along XIVC—XIVC (hereinafter referred to as C—C) of FIG. 13A of the stage apparatus 60 and FIG. 14D is a cross-sectional view along XIVD—XIVD (hereinafter referred to as D—D) of FIG. 13A of the stage apparatus 60.
Figure 14D:
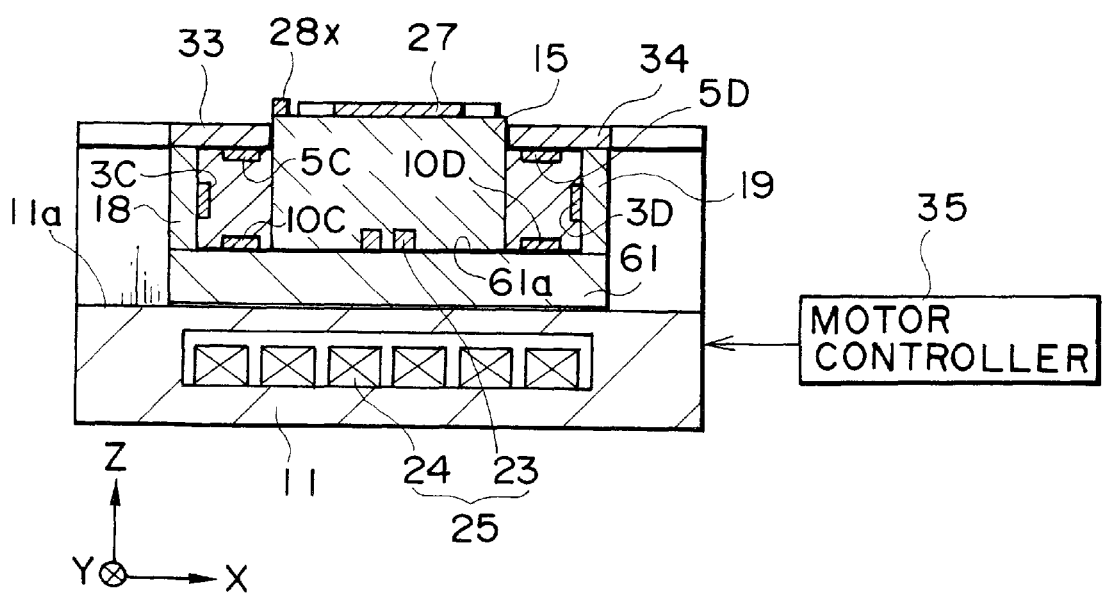

The base plate 61 of the stage apparatus 60 is fitted at the side of the reference guide plane 11a of the moveable frame 17, as shown in FIG. 13B, FIG. 14B and FIG. 14D. The base plate 61 has a size of distance from the Y-guide 18 to the Y-guide 19 in the X-direction and a size of distance from the coupling section 21 to the coupling section 22 in the Y-direction. A guide plane 61a parallel to the reference guide plane 11a is provided at the upper surface of the base plate 61.

The opening 16 of the moveable frame 17 of the stage apparatus 30 described above is not provided at the moveable frame 17 of the stage apparatus 60.

As a result, the table 15 of the stage apparatus 60 does not move along the reference guide plane 11a as with the stage apparatus 30 but rather moves within a plane parallel to the reference guide plane 11a along the guide plane 61a of the base plate 61.

As shown in FIG. 14B and FIG. 14D, the air pads 10A, 10B, 10C and 10D of the stage apparatus 60 are provided at the surface of the table 15 facing the guide plane 61a of the base plate 61 (also refer to FIG. 13D). The air pads 10A to 10D are also connected to an air supply source (not shown).

At the stage apparatus 60, the air pads 2A to 2D are provided at the surface of the base plate 61 facing the reference guide plane 11a of the stage base 11, as shown in FIG. 14B and FIG. 14C.

Next, a description is given of a positioning operation for the stage apparatus 60 configured in the above manner.

When air is supplied to the air pads 1A to 1D, 2A to 2D and 4A to 4D, the moveable frame 17 is supported in such a manner as to not make contact with the guide planes 13a, 14a, 31a and 32a (refer to FIG. 5A) and the reference guide plane 11a as in the case for the stage apparatus 30 described above. The Y-position for the moveable frame 17 is kept fixed without any rotation about the Z-axis within a space interposed between the X-guides 13 and 14 and the amount of levitation (Z-position) away from the reference guide plane la can be precisely defined. The table 15 is supported in such a manner as to not make contact with the guide planes 18a and 19a and the X-position of the table 15 with respect to the moveable frame 17 is also kept fixed without rotating about the Z-axis within the moving space by the air supplied from the air pads 3A to 3D.

The table 15 is supported in such a manner as to not make contact with the guide planes 33a and 34a of the claws 33 and 34 by air supplied from the air pads 5A to 5D.

The table 15 is urged towards the guide plane 61a of the base plate 61 by the air pads 5A to 5D and the claws 33 and 34, and is urged towards the guide planes 33a and 34a of the claws 33 and 34 by the air pads 10A to 10D and the base plate 61 as a result of air being supplied from the air pads 5A to 5D and the air pads 10A to 10D.

In other words, the table 15 is simultaneously subjected to pressurization in the Z-direction due to the air pad 5A and the air pad 10A which face each other, the claw 33, and the base plate 61, pressurization in the Z-direction due to the air pad 5B and air pad 10B which face each other, the claw 34, and the base plate 61, pressurization in the Z-direction due to the air pad 5C and the air pad 10C, the claw 33, and the base plate 61, and pressurization in the Z-direction due to the air pad 5D and air pad 10D, the claw 34, and the base plate 61.

The amount of levitation (Z-position) of the table 15 of the stage apparatus 60 from the guide plane 61a is therefore strictly defined as a result of being subjected to pressurization in the Z-direction simultaneously at four different locations within the XY plane.

When, in this state, the motor controller 35 (refer to FIG. 14D) controls the planar motor 25 so as to generate drive force in the X-direction and/or Y-direction, as in the afore-mentioned embodiments, the moveable frame 17 and the table 15 move and precise positioning of the sample 20 on the table 15 in the X and Y-directions can be achieved.

According to the stage apparatus 60 of the fifth embodiment provided with the base plate 61 at the moveable frame 17, the table 15 can be smoothly moved without movement up or down during the positioning operation.

Figure 15A:
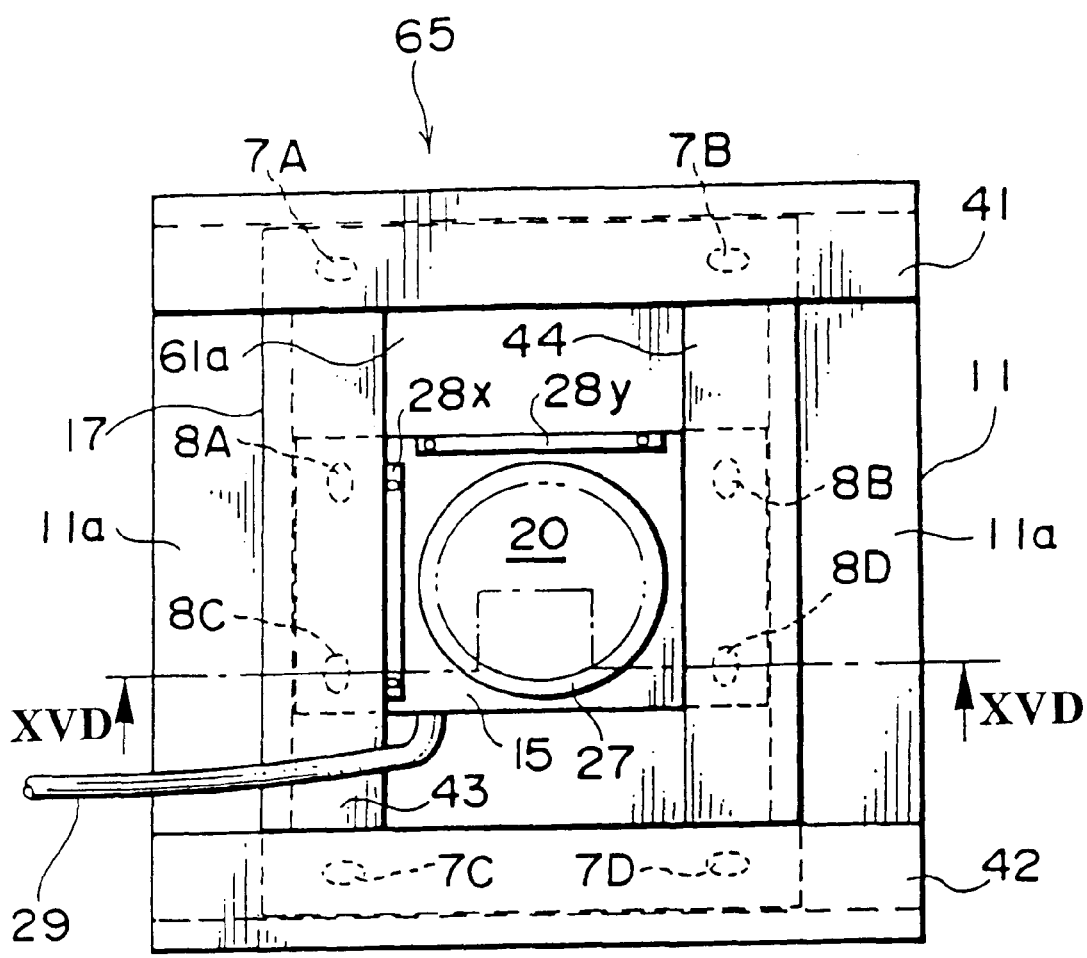

In the fifth embodiment, a description is given of the stage apparatus 60 fitted with the base plate 61 at the moveable frame 17 of the stage apparatus 30 of the second embodiment. However, the base plate 61 can also be similarly provided at the moveable frame 17 of the stage apparatus 40 (refer to FIG. 7A to FIG. 9D) of the third embodiment, as with stage apparatus 65 shown in FIG. 15. In FIG. 15A and FIG. 15B, elements of the configuration performing the same function as for the stage apparatus 40 (refer to FIG. 7A to FIG. 9D) are given the same numerals with FIG. 15B corresponding to a cross-sectional view along D—D of FIG. 15A.

In the first to fifth embodiments, the planar motor 25 is configured from permanent magnets 23, 23, . . . provided at the table 15 and electromagnets 24, 24, . . . provided at the stage base 11 but it is also possible to provide the permanent magnets 23, 23, . . . at the stage base 11 and provide the electromagnets 24, 24, . . . at the table 15.

Sixth Embodiment

Next, a description is given of a sixth embodiment.

In a stage apparatus of a sixth embodiment, the stage apparatus 30 (refer to FIG. 4A to FIG. 6D) of the second embodiment is provided with an auxiliary motor 66 and the motor controller 35 (refer to FIG. 6D) of the stage apparatus 30 is replaced with a motor controller 67.

Figure 16A:
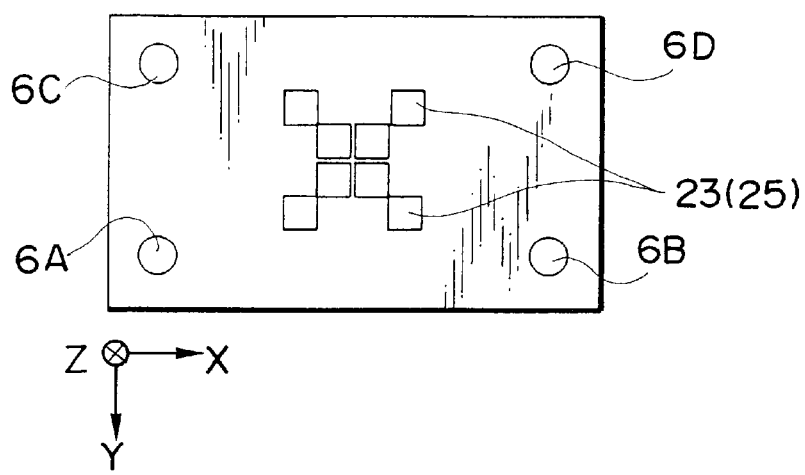
FIG. 16A is a view from below of the table 15, for illustrating an auxiliary motor.
Figure 16B:
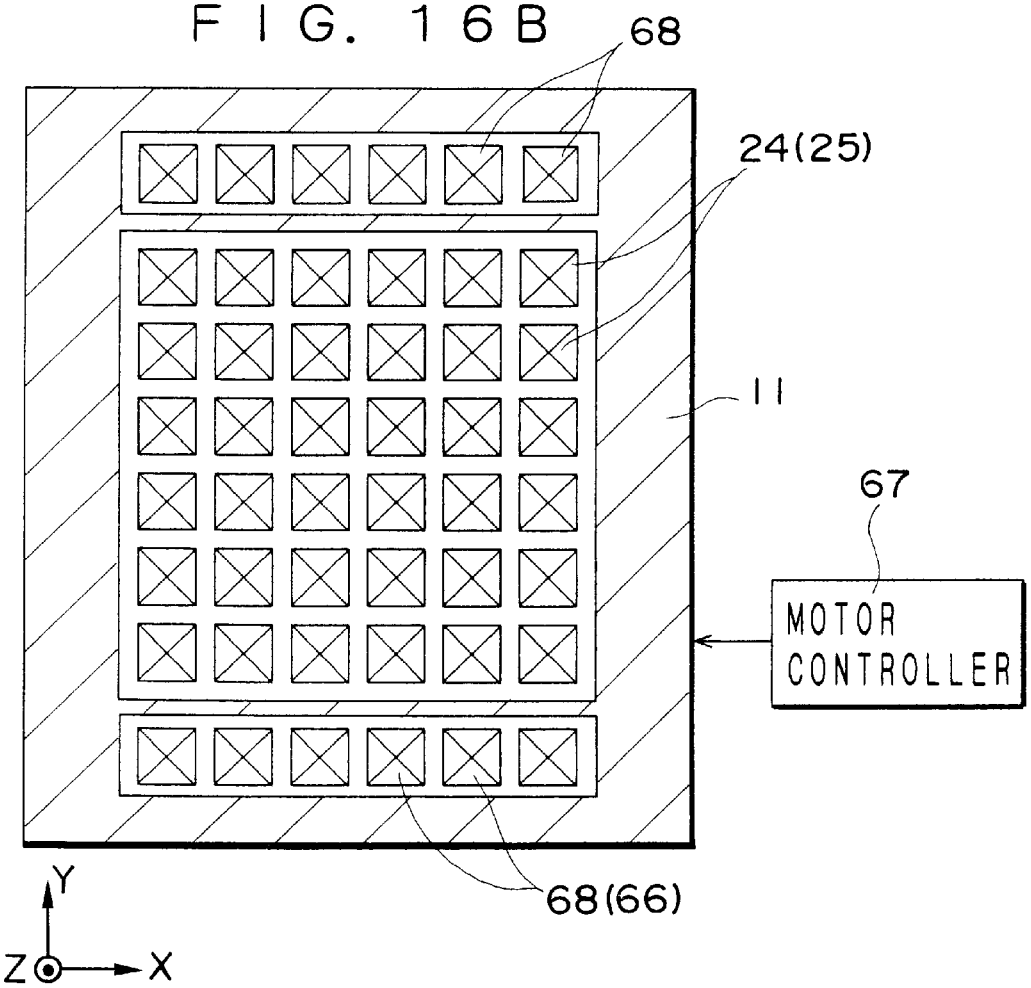
FIG. 16B is a view, corresponding to FIG. 3B, illustrating the auxiliary motor.

FIG. 16A to FIG. 16C respectively show a view from below of the table 15 constituting the stage apparatus of the sixth embodiment, a cross-sectional view cut in the XY plane of the stage base 11, and a view from below of the moveable frame 17. In FIG. 16A to FIG. 16C, structural elements (2A to 2D, 6A to 6D, 11, 15 to 19, 21 to 25) that perform the same function as those for the stage apparatus 30 (refer to FIG. 4A to FIG. 4D) are given the same numerals.

As shown in FIG. 16B, a plurality of electromagnets 68, 68, . . . are provided within the stage base 11 constituting the stage apparatus of the sixth embodiment. The electromagnets 68, 68, . . . are arranged in rows along the X-direction at a +Y side and a −Y side of the electro magnets 24, 24, . . . constituting the planar motor 25. Six electromagnets 68, 68, . . . are shown per row in FIG. 16B.

As shown in FIG. 16C, a plurality of permanent magnets 69, 69 . . . are provided at the same surface as the surface where the air pads 2A to 2D are provided at the moveable frame 17 constituting the stage apparatus of the sixth embodiment. Two permanent magnets 69 and 69 provided between the air pads 2A and 2B of the coupling section 21 and two permanent magnets 69 and 69 provided between the air pads 2C and 3D of the coupling section 22 are shown in FIG. 16C.

The auxiliary motor 66 is constituted by the electromagnets 68, 68, . . . and the permanent magnets 69, 69 . . . , and motor controller 67 is connected to each of the electromagnets 24 constituting the planar motor 25 and each of the electromagnets 68 constituting the auxiliary motor 66.

The motor controller 67 then controls the planar motor 25 with respect to two axis so as to generate drive force in the X and Y directions and subjects the auxiliary motor 66 with respect to single-axis control so as to generate a drive force in the X-direction. These drive forces are then reliably transmitted to the table 15 and the moveable frame 17 via the upper plate of the stage base 11.

With the stage apparatus of the sixth embodiment configured in this manner, while the table 15 is being positioned in the Y-direction, the motor controller 67 controls the planar motor 25 in the same manner as for the stage apparatus 30 of the second embodiment so that a drive force is generated in the Y-direction. As a result, the Y-position of the table 15 and sample 20 are precisely decided.

While the table 15 is being positioned in the Y-direction, with the stage apparatus of the sixth embodiment, the motor controller 67 controls the planar motor 25 so that a drive force is generated in the X-direction, and the auxiliary motor 66 is controlled so that a drive force is also generated in the X-direction. The drive force of the planar motor 25 is transmitted to the table 15 and the drive force of the auxiliary motor 66 is directly transmitted to the moveable frame 17.

The table 15 driven by the planar motor 25 and the moveable frame 17 driven by the auxiliary motor 66 then move integrally in the X-direction so that the X-position of the table 15 and sample 20 is decided in a precise manner.

According to the stage apparatus of the sixth embodiment provided with the auxiliary motor 66, movement in the X-direction becomes more smoother, so that straight line motion of the table 15 is improved. And the load on the planar motor 25 when moving in the X-direction is reduced.

In the sixth embodiment, the auxiliary motor 66 is configured from permanent magnets 69, 69, . . . provided at the moveable frame 17 and electromagnets 68, 68, . . . provided at the stage base 11 but it is also possible to provide the permanent magnets 69, 69, . . . at the stage base 11 and provide the magnets 68, 68, . . . at the table 15.

Seventh Embodiment

Next, a description is given of an seventh embodiment.

The seventh embodiment relates to an inspection apparatus 100 employing one of the stage apparatus 10, 30, 40, 60, 65 of the first embodiment to seventh embodiment. It should be noted that in order to use the stage apparatus of the seventh embodiment, a discharge channel surrounding air pads is provided to discharge an air ejected from the air pads outside a chamber. Due to this, the stage apparatus can be used in a vacuum, because an ejected air is prevented from leaking to the chamber.

Figure 17:
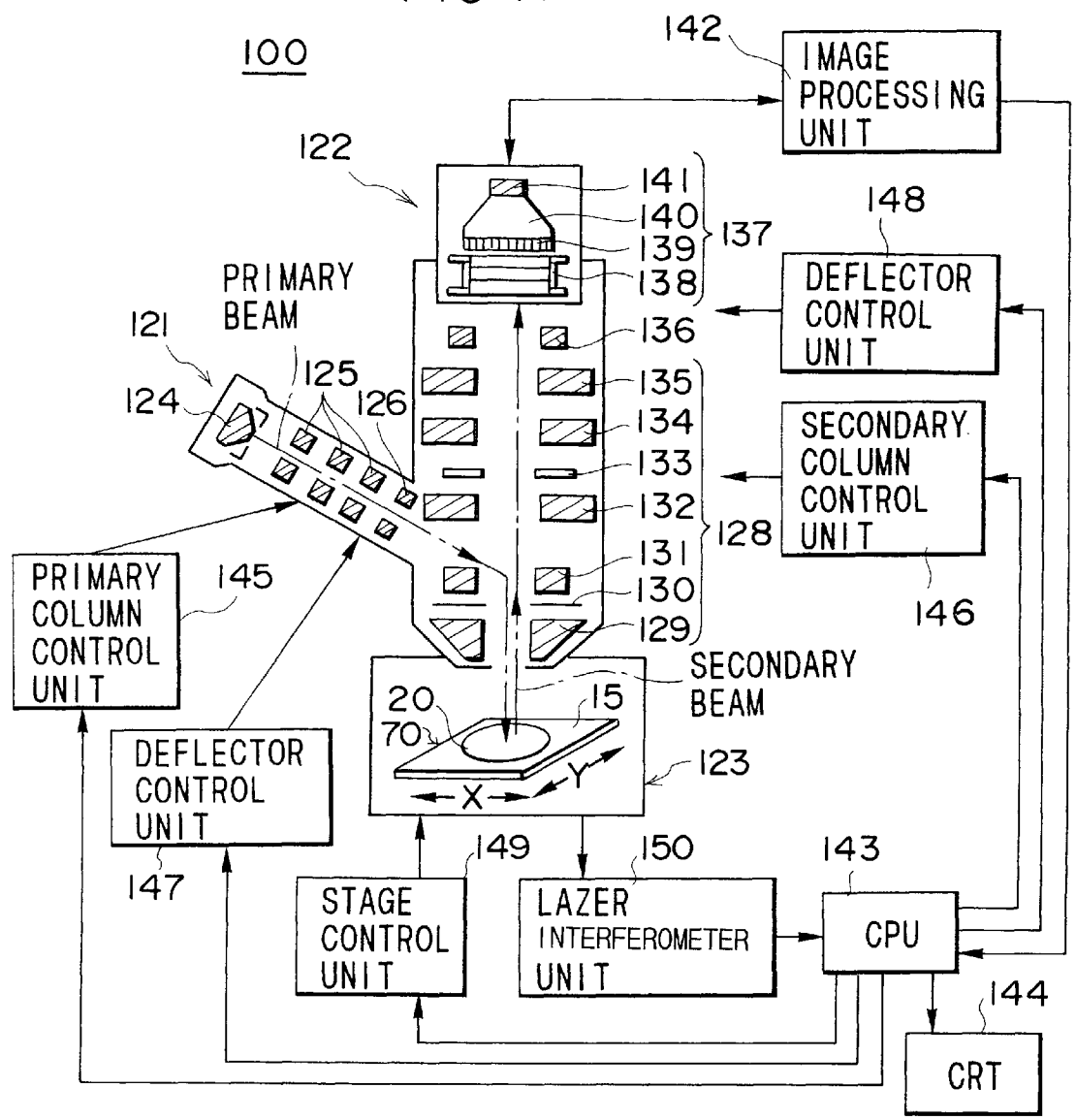
FIG. 17 is a view showing a configuration for an inspection apparatus 100.

As shown in FIG. 17, the inspection apparatus 100 of the seventh embodiment comprises a primary column 121, a secondary column 122 and a chamber 123. The primary column 121 is fitted in such a manner as to be inclined with respect to the side surface of the secondary column 122. The chamber 123 is fitted at a lower part of the secondary column 122. The primary column 121, secondary column 122 and chamber 123 are connected to a vacuum evacuation system (not shown) and are evacuated by a turbo pump of the vacuum evacuation system so that an internal vacuous state is maintained.

A description is now given of the configuration of the primary column 121, the secondary column 122 and the chamber 123, in that order.

Primary Column

An electron gun 124 for emitting an electron beam is located within the primary column 121. The cathode of the electron gun 124 is formed as a square cathode and is made of Lanthanum Hexaboride (LaB$_6$) in order to derive a large current.

Within the primary column 121, a primary optical system 125 and a primary deflector 126 are located on the optical axis of the primary column 121 in order that the electron beam (hereinafter referred to as "primary beam") emitted from the electron gun 124 can be projected on the sample 20. A quadrupole (or octpole) static lens (or magnetic lens) that is asymmetric about the axis of rotation can be used for the primary optical system 125. However, in the seventh embodiment, the primary optical system 125 is described with three stages of electrostatic lenses 125a, 125b and 125c (refer to FIG. 19).

Figure 18A:
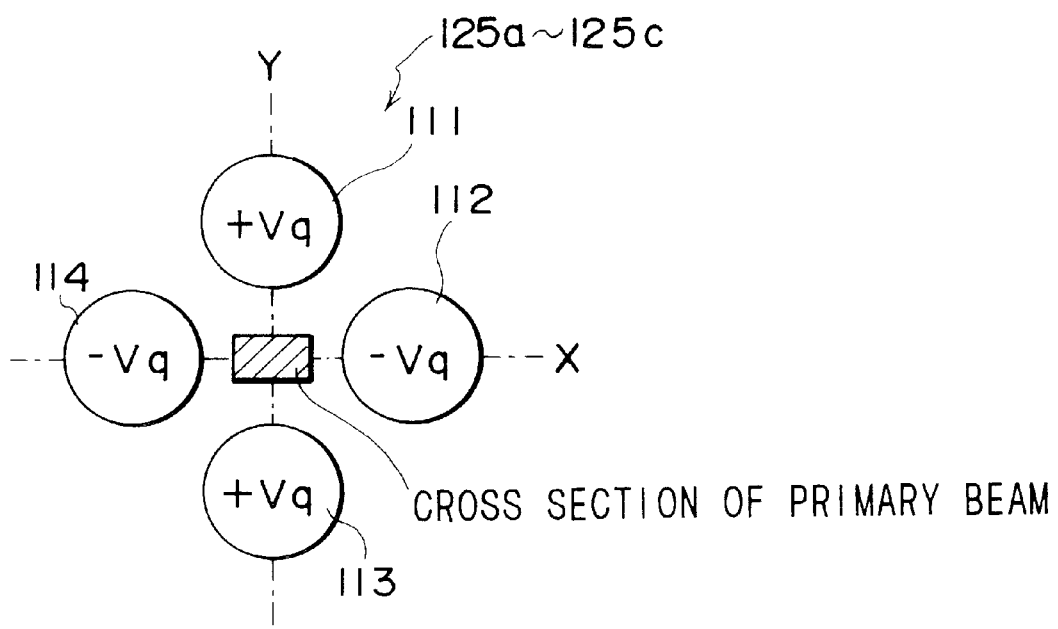
FIG. 18A is a view showing a configuration for a primary optical system 25.

The electrostatic lenses 125a, 125b and 125c each comprise four cylindrical rods 111 to 114, as shown in FIG. 18A. Opposing electrodes (111 and 113, and 112 and 114) are set to equal potentials and voltages of opposite characteristics (+Vq to 111 and 113, –Vq to 112 and 114) are applied.

The electrostatic lenses 125a, 125b and 125c can then create focussing and divergence using the major axis (X-axis) and minor axis (Y-axis) of the rectangular cathode as with a so-called cylindrical lens can do so. The cross-section of the primary beam can therefore be made an arbitrary shape without electron emission loss by optimizing lens conditions for each of the electrostatic lenses 125a, 125b and 125c. A case where the cross-section of the primary beam is rectangular is shown in FIG. 18A.

Figure 18B:
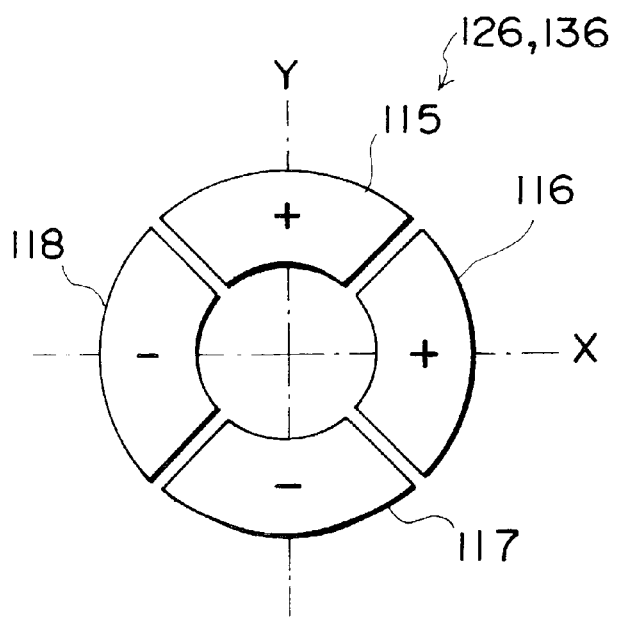
FIG. 18B is a view showing a configuration for a deflector.

Electrostatic deflectors or magnetic deflectors can be used for the primary deflector 126 but in the seventh embodiment a description is given of an electrostatic deflector capable of bi-axial deflection configured from four independent electrodes 115 to 118, as shown in FIG. 18B. The trajectory of the primary beam can be deflected along the X-axis by changing the voltages applied to electrodes 116 and 118. The trajectory of the primary beam can also be deflected along the Y-axis by changing the voltages applied to electrodes 115 and 117.

A primary column control unit 145 for controlling voltages of the lenses of the primary optical system 125 and a deflector control unit 147 for controlling voltages applied to the primary deflector 126 are connected to the primary column 121 (refer to FIG. 17). The primary column control unit 145 and the deflector control unit 147 are connected to a CPU 143.

Chamber

The stage apparatus 70 of the seventh embodiment is located within the chamber 123, as shown in FIG. 17, and the sample 20 is mounted at the table 15 of the stage apparatus 70. A prescribed retarding voltage (described later) is applied to the table 15 of the stage apparatus 70.

A stage control unit 149 for controlling the XY-directions of the table 15 of the stage apparatus 70 and a laser interferometer unit 150 for outputting a stage movement signal in response to the direction and amount of movement of the table 15 are connected to the chamber 123. The stage control unit 149 and the laser interferometer unit 150 are connected to the CPU 143. The motor controller 35 (not shown) for controlling the planar motor 25 (omitted from the drawings here) of the stage apparatus 70 is included at the stage control unit 149.

Secondary Column

Within the secondary column 122, as shown in FIG. 17, a cathode lens 129, pneumanical aperture (aperture diaphragm) 130, Wien filter 131, second lens 132, field aperture (field stop) 133, third lens 134, fourth lens 135, secondary deflector 136, and detector 137 are located on the optical axis of the secondary column 122 in order to detect the secondary beam (described later) generated from the sample 20.

Figure 19:
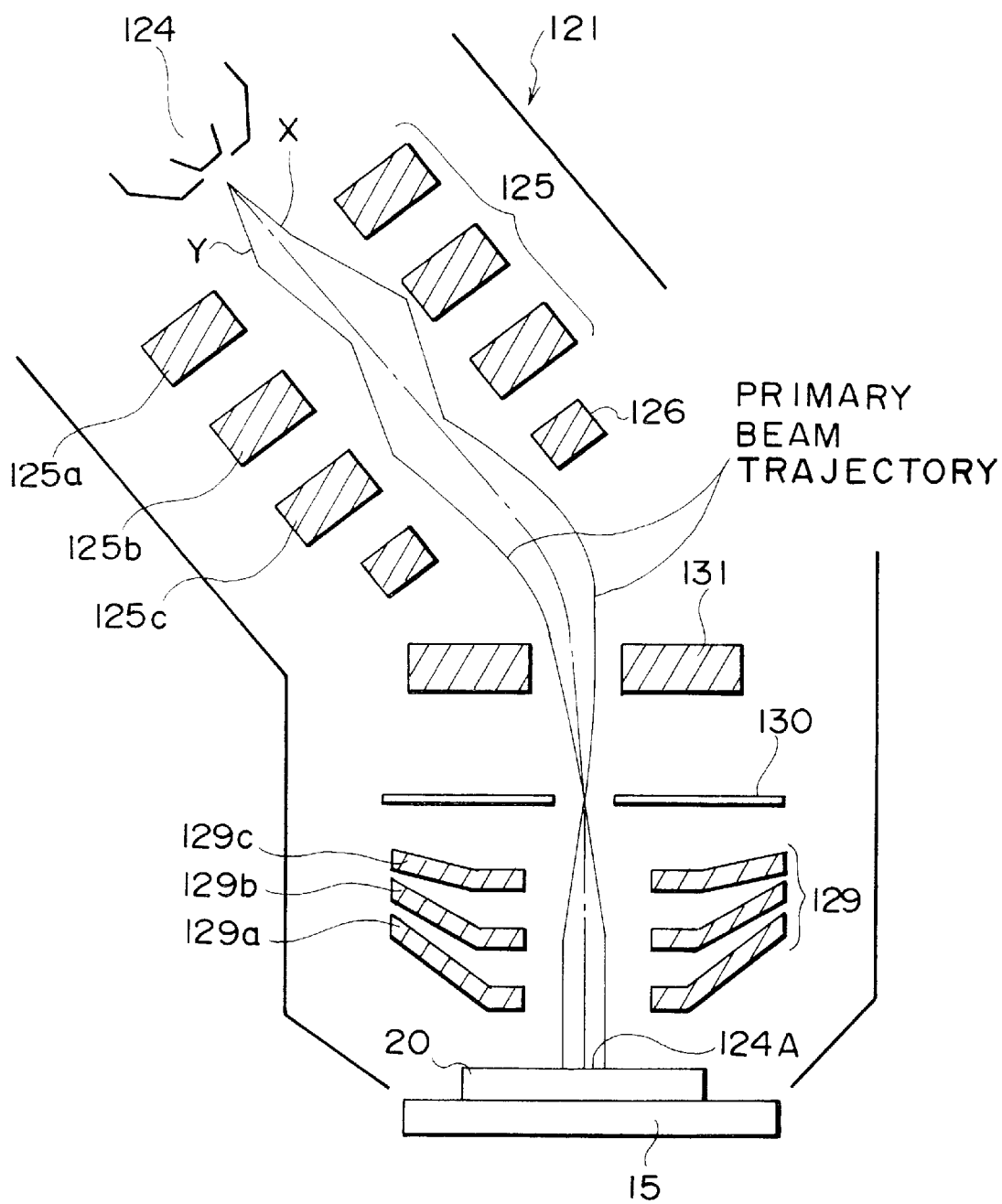
FIG. 19 is a view showing the trajectory of a primary beam.

The cathode lens 129 is comprised of a plurality of electrodes. A description will be made as for an example configuration with three electrodes 129a, 129b and 129c, as shown in FIG. 19. In this case, a lens function is implemented by applying voltages to a first electrode 129a which is the first electrode from the bottom of the cathode lens 129 (the side of the sample 20) and a second electrode 129b and by setting a third electrode 129c at zero potential.

The pneumanical aperture 130 (refer to FIG. 17) corresponds to an aperture diaphragm and the aperture angle of the cathode lens 129 is defined by the pneumanical aperture 130 which is in the shape of a thin-film of a metal such a Mo, etc., in the middle of which a circular hole is made. The 130 is then located in such a manner that this opening becomes the position of the focal point of the cathode lens 129. The pneumanical aperture 130 and the cathode lens 129 thereby constitute a telecentric electro-optical system.

The Wien filter 131 is a deflector acting as a magnetic prism which causes electrically charged particles (for example, the secondary beam) fulfilling the Wien conditions (E=vB, where v is the velocity of the electrically charged particles, E is an electric field, and B is a magnetic field, where E⊥B) to prorogate in-a straight line and which causes the trajectory of the remaining electrically charged particles (for example, the primary beam) to become curved.

Figure 20:
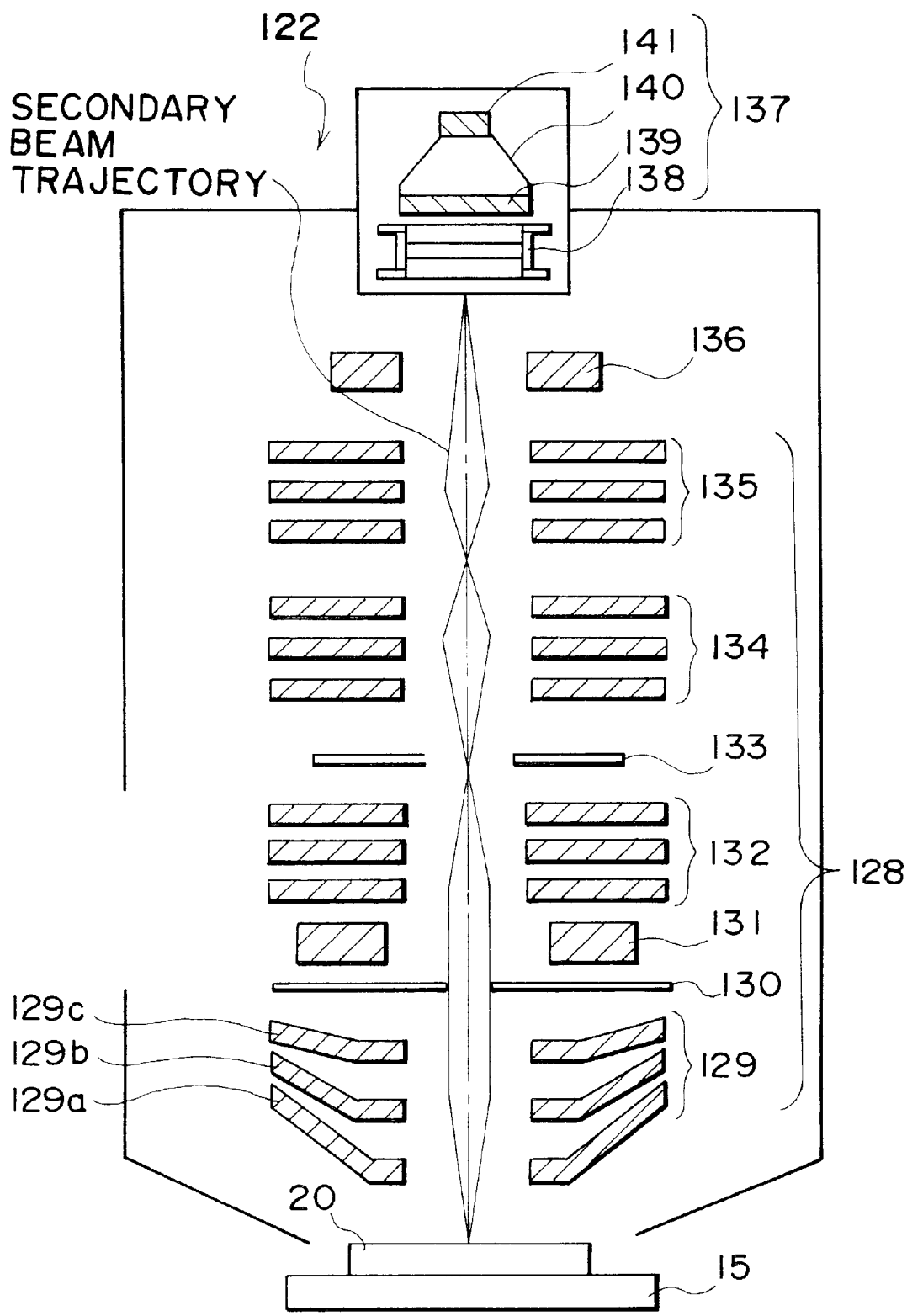
FIG. 20 is a view showing the trajectory of a secondary beam.
Figure 21:
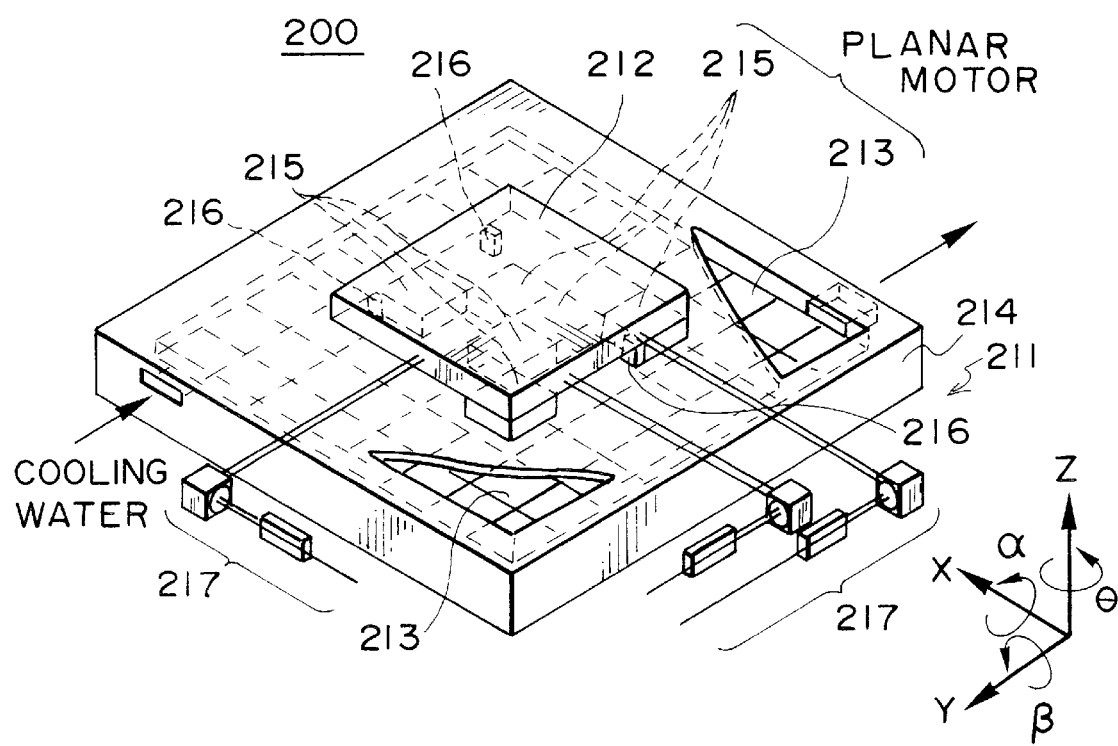
FIG. 21 is a perspective view of a conventional stage apparatus 200.
Figure 22:
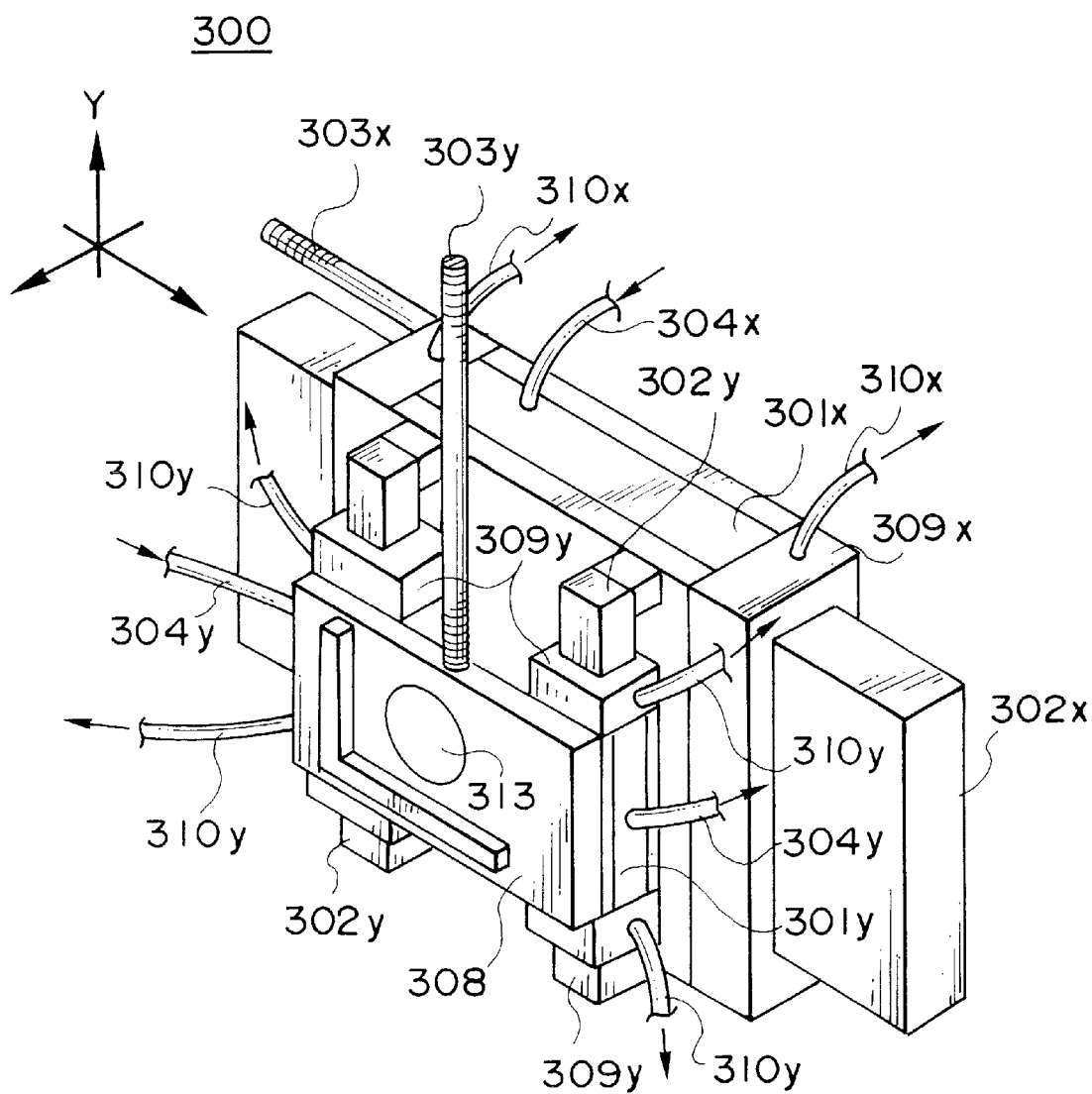
FIG. 22 is a perspective view of a conventional stage apparatus 300.

Each of the second lens 132, third lens 134 and fourth lens 135 is a lens which is symmetrical about the axis of rotation and is referred to as a unipotential lens and is configured of three electrodes (refer to FIG. 20). The lens operation is usually controlled for each lens by keeping the outer two electrodes at zero potential and changing a voltage applied to the central electrode.

A field aperture 133 is located between the second lens 132 and the third lens 134 (refer to FIG. 17) and is for limiting the field of view to the required range, in the same manner as a field stop of an optical microscope.

The cathode lens 129, pneumanical aperture 130, Wien filter 131, second lens 132, field aperture 133, third lens 134 and fourth lens 135 are collectively referred to as a secondary optical system 128.

The secondary deflector 136 is an electrostatic deflector capable of twin-axial deflection and is composed of four electrodes 115 to 118, as with the primary deflector 126 (refer to FIG. 18B). The trajectory of the secondary beam along the X-axis can be deflected by changing the voltage applied to the electrodes 116 and 118. The trajectory of the secondary beam can also be deflected along the Y-axis by changing the voltages applied to electrodes 115 and 117.

The detector 137 (refer to FIG. 17) comprises an MCP 138 for accelerating and multiplying electrons, a fluorescent surface 139 for converting electrons to light and an FOP (Fiber-Optic Plate) 140 having an optical relay lens (not shown), and a two-dimensional CCD sensor 141 for picking-up optical images. The two-dimensional CCD sensor 141 has a plurality of light-receiving pixels arrayed in two dimensions. An image processing unit 142 is connected to the detector 137.

A secondary column control unit 146 for controlling lens voltages for the cathode lens 129, second lens 132, third lens 134 and fourth lens 135, and controlling an electric field applied to the Wien filter 131, and a deflector control unit 148 for controlling the voltage applied to the secondary deflector 136 are connected to the secondary column 122. The secondary column control unit 146, deflector control unit 148, and image processing unit 142 are connected to the CPU 143. A CRT 144 for displaying images is connected to the CPU 143.

A description is given of the trajectory, etc., of the primary and secondary beams of the inspection apparatus 100 of the above configuration.

Primary Beam

The primary beam from the electron gun 124 is accelerated by an accelerating voltage of the electron gun 124 and, as shown in FIG. 19, becomes incident to the central part of the Wien filter 131 while being subjected to the lens action of the primary optical system 125 and the deflection action of the primary deflector 126. FIG. 19 shows the trajectory of electrons emitted at the X-direction cross-section of the rectangular cathode and the trajectory of electrons emitted at the Y-direction cross-section.

The trajectory of the primary beam incident to the Wien filter 131 is curved by the deflecting operation of the Wien filter 131 and reaches the opening of the pneumanical aperture 130. The primary beam is then focussed at the opening of the is pneumanical aperture 130 as a result of the settings of the lens voltage of the primary optical system 125.

The primary beam focussed on the opening of the pneumanical aperture 130 then irradiates the upper surface of the sample 20 via the cathode 129. The primary beam passing through the cathode lens 129 becomes a parallel beam because the pneumanical aperture 130 and the cathode lens 129 constitute a telecentric electro-optical system and the upper surface of the sample 20 is therefore irradiated by a perpendicular beam in a even manner. Namely, Kohler illumination the same as in the optical microscope is implemented.

A negative electric field with respect to the primary beam is formed between the electrode 129a of the cathode lens 129 and the surface of the sample 20 because the retarding voltage is applied to the table 15 on which the sample 20 is mounted. The primary beam passing through the cathode lens 129 has been slowed down by the time of reaching the surface of the sample 20 and charging up of and damage to the sample 20 is prevented.

Unnecessary parts of the electron beam that are diffused within the inspection apparatus 100 are prevented from reaching the surface of the sample 20 by the pneumanical aperture 130 and charging up and contamination of the sample 20 is therefore prevented.

An irradiation region 124A of the primary beam at the upper surface of the sample 20 is adjusted by controlling the lens voltages to the primary optical system 125 and is substantially rectangular in this seventh embodiment. The position of the irradiation region 124A can be moved in the X and Y direction on the surface of the sample 20 by deflecting the trajectory of the primary beam in the X and Y direction by controlling the voltages applied to the primary deflector 126.

Secondary Beam

On the other hand, when the upper surface of the sample 20 is irradiated with the primary beam, at least one type of secondary beam of secondary electrons, reflected electrons, or backscattered electrons are generated from the irradiation region 124A. The secondary beam possesses two-dimensional image information for the irradiation region 124A. The secondary beam therefore has an image which is distinct and without shadows because the primary beam irradiates the sample 20 perpendicularly.

A positive electric field with respect to the secondary beam is formed between the electrode 129a of the cathode lens 129 shown in FIG. 20 and the surface of the sample 20 because the retarding voltage is applied to the table 15 on which the sample 20 is mounted. The secondary beam generated from the sample 20 is accelerated towards the cathode lens 129 and is therefore guided into the visible field of the secondary optical system 128 in an efficient manner.

The secondary beam is subjected to the focussing action of the cathode lens 129, passes through the pneumanical aperture 130 and proceeds in a straight line without being subjected to the deflecting action of the Wien filter 131 so as to reach the field aperture 133 via the second lens 132. At this time, the sample 20 and the field aperture 133 constitute a conjugate relationship and the image of the sample 20 is formed at the field aperture 133.

The occurrence of lens aberrations can be suppressed, because an image of the secondary beam is not just formed at the cathode lens 129 but one-time image formation is implemented by the cathode lens 12 and the second lens 132. By changing the electromagnetic field applied to the Wien filter 131, just electrons (for example, secondary electrons, reflected electrons or backscattered electrons) in a specified energy band are selected and allowed to pass.

The secondary beam passing through the field aperture 133 is repeatedly focussed and dispersed by the third lens 134 and fourth lens 135 located at a latter stage and the image formation is made at once image-formed by the third lens 134, so as to reach the detecting surface of the detector 137 via the fourth lens 135. At this time, the image of the sample 20 formed by the secondary beam is formed again on the detection surface.

The secondary beam generated from the sample 20 is image-formed three times before being incident to the detector 137. The third lens 134 and the fourth lens 135 can also jointly perform one-time image formation (with images formed two times in total).

The field aperture 133 blocks out unnecessary parts of the secondary beam together with the latter stage third lens 134 and fourth lens 135 so that charging up and contamination of the detector 137 is prevented. For the secondary beam, the pneumanical aperture 130 serves to suppress lens aberrations of the latter stage second lens 132 to fourth lens 135.

The secondary beam generated from the sample 20 and forming an image on the detection surface of the detector 137 is accelerated and multiplied during passage through the MCP 138 within the detector 137 and converted to light at the fluorescent surface 139. Light from the fluorescent surface 139 then forms an image at the image-sensing surface of the two-dimensional CCD sensor 141 via the FOP 140.

The third lens 134 and the fourth lens 135 are lenses for enlarging and projecting an intermediate image obtained on the field aperture 133. The two-dimensional image of the irradiation region 124A on the surface of the sample 20 is enlarged and projected onto the detection surface of the detector 137. The position of the two-dimensional image projected onto the detection surface of the detector 137 can be moved in the X and Y directions by deflecting the trajectory of the secondary beam in the X and Y directions by controlling the voltages applied to the secondary deflector 136.

After the portion of the two-dimensional image (image of the secondary beam) of the irradiation region 124A projected onto the detection surface of the detector 137 is converted into an optical image at the fluorescent surface 139, the optical image thus obtained is projected onto the image-sensing screen of the two-dimensional CCD sensor 141 via the FOP 140. The FOP 140 compresses the optical image by approximately $\frac{1}{3}$ and then projects the optical image in line with the image size at the fluorescent surface 139 and the projected size at the two-dimensional CCD sensor 141.

The optical image projected onto the image-sensing surface of the two-dimensional CCD sensor 141 is photoelectrically converted at the two-dimensional CCD sensor 141 and an image signal obtained in this manner is outputted from the two-dimensional CCD sensor 141 to the image processing unit 142 (refer to FIG. 17), for example, each $\frac{1}{30}$ of a second. The image processing unit 142 A/D converts the image signal from the two-dimensional CCD sensor 141 and stores the converted image signal in an internal VRAM to make image information. Then the image processing units 142 outputs this image information to the CPU 143. The CPU 143 then displays the image of the sample 20 on the CRT 144. The CPU 143 then specifies the locations of defects of the sample by subjecting the image information to template matching, etc.

According to the inspection apparatus 100 of the seventh embodiment, a discharge channel is provided to discharge an air ejected from the air pads outside the chamber. Due to this, detrimental effects such as the weakening of a vacuum within the chamber 123 are prevented, precise positioning of the sample 20 can be achieved, and thus inspection can be made to be extremely reliable.

In the seventh embodiment, a description is given of the inspection apparatus 100 where the cathode lens 129 and the Wien filter 131 etc. are shared by the path (primary beam system) by which the primary beam is projected on the sample 20 and the path (secondary beam system) by which the secondary beam from the sample 20 reaches the detector 137. However it is also possible to have an independent primary beam system and secondary beam system, with each being equipped with a cathode lens.

In the seventh embodiment described above, a description is given of an example where a sample image is captured by a two-dimensional CCD sensor 141 where a plurality of light-receiving pixels are arrayed in two dimensions. However, it is also possible to sense an image of the sample by providing an image sensor where a plurality of line CCD sensors are arranged in parallel or a TDI (Time Delay Integration) array CCD sensor in place of the two-dimensional CCD sensor 141.

Further, a description is given of an example of inspection apparatus, but the present invention is by no means limited in this respect and may also be employed in an exposure apparatus or EB exposure apparatus.

In the case that a static pressure gas bearing is used in the special gas, it is possible to reduce contamination of the special gas atmosphere due to air from the static pressure gas bearing. And since there is no contact portion of a planar motor when moving, it is possible to suppress production of dust.

According to the embodiments of the invention described above, it is possible to reduce the occurrence of inter-axial interference even with a simplified planar motor control system and a stage apparatus capable of highly precise positioning which is extremely reliable can therefore be provided. Positioning is also not influenced by discharging means for fluid supplied in order to guide and support the table in a non-contact manner, so that a highly reliable stage apparatus with improved positioning precision can be provided.

According to the inspection apparatus of the seventh embodiment, highly precise positioning of the sample on the table can be achieved and extremely reliable inspection results can therefore be obtained.

What is claimed is:

1. A stage apparatus comprising:

a base member;

a table member which moves in a plane parallel to a guide plane provided at said base member;

a first guide member which guides said table member in a first direction and moves along the guide plane;

a second guide member which guides said first guide member in a second direction perpendicular with respect to the first direction;

non-contact bearings which provide guidance and support in such a manner that there is no contact between each of said base member, said table member, and said second guide member, and said first guide member;

a planar motor constituted by magnets provided at one of either the base member or said table member and electromagnets provided at the remaining one of either said base member or said table member; and a movement control apparatus which controls said planar motor, so that drive force in directions parallel to the guide plane is generated to move said table member.

2. The stage apparatus according to claim 1, wherein:

said first guide member is equipped with an opening penetrating to the guide plane in which said table member moves along the guide plane, and said stage apparatus further comprises a levitation apparatus which levitates said table member and said first guide member away from the guide plane within the opening.

3. The stage apparatus according to claim 1, further comprising a first urging device which urges said table member towards the guide plane, and a second urging device which urges said first guide member towards the guide plane.

4. The stage apparatus according to claim 3, wherein:

said first urging device comprises;
  a first urging member provided integrally with said first guide member, and
  a non-contact bearing which provides guidance and support in a non-contact manner between said first urging member and said table member.

5. The stage apparatus according to claim 4, wherein:

said second urging device comprises;
  a second urging member provided integrally with the second guide member; and
  a non-contact bearing which provides guidance and support in a non-contact manner between said second urging member and said first guide member.

6. The stage apparatus according to claim 3, wherein:

said second urging device comprises;
  a second urging member provided integrally with said second guide member; and
  a non-contact bearing which provides guidance and support in a non-contact manner between said second urging member and said first guide member.

7. The stage apparatus according to claim 1, wherein:

said second guide member is provided integrally with said base member.

8. The stage apparatus according to claim 2, wherein:

said levitation apparatus comprises;
  a levitation control apparatus which controls said planar motor so as to generate drive force in directions parallel to the normal of the guide plane.

9. The stage apparatus according to claim 2, wherein:

said levitation apparatus comprises a static pressure bearing which provides guidance and support in a non-contact manner between said table member and the guide plane.

10. The stage apparatus according to claim 1, wherein:

said non-contact bearing is a static pressure bearing which provides guidance and support via a fluid.

11. The stage apparatus according to claim 9, wherein:

said static pressure bearing comprises:
  pads through which fluid expels, and
  a discharge unit provided about said pads which discharges fluid expelled from said pads.

12. The stage apparatus according to claim 9, wherein:

said static pressure bearing is a static pressure gas bearing.

13. The stage apparatus according to claim 12, wherein:

said static bearing comprises;
  pads through which fluid expels, and
  a discharge unit provided about said pads which discharges fluid expelled from said pads.

14. The stage apparatus according to claim 1, further comprising:

a guide member driver which generates drive force for said first guide member in directions parallel to the guide plane.

15. The stage apparatus according to claim 14, wherein:

said guide member driver is provided at the base member adjacent to said planar motor.

16. The stage apparatus according to claim 15, wherein:

said guide member driver is embedded in said base member.

17. The stage apparatus according to claim 14, wherein:

said guide member driver is located along the direction of movement of said first guide member.

18. The stage apparatus according to claim 1, wherein:

said first guide member is fitted into said table member.

19. An inspection apparatus comprising a stage apparatus;

an irradiation device which irradiates a beam onto a sample mounted at said stage apparatus; and a detection device which detects a secondary beam generated from the sample as a result of being irradiated with the beam;

said stage apparatus comprising:

a base member;

a table member which moves within a plane parallel to a guide plane provided on said base member;

a first guide member which guides said table member in a first direction and moves along the guide plane;

a second guide member which guides said first guide member in a second direction perpendicular with respect to the first direction;

non-contact bearings which provide guidance and support in such a manner that there is no contact between said base member, said table and said second guide member, and said first guide member;

a planar motor constituted by magnets provided at one of either said base member or said table member and electromagnets provided at the remaining one of either said base member or said table member; and a movement control apparatus which controls said planar motor, so as to generate drive force in directions parallel to the guide plane to move said table member.

20. A beam irradiation apparatus comprising:

a stage; and an irradiation unit which irradiates a beam onto a sample mounted at the stage;

said stage comprising:
  a base member;
  a table member which moves in a plane parallel to a guide plane provided at said base member;
  a first guide member which guides said table member in a first direction and moves along the guide plane;
  a second guide member which guides said first guide member in a second direction perpendicular with respect to the first direction;
  non-contact bearings which provide guidance and support in such a manner that there is no contact between each of said base member, said table member, and said second guide member, and said first guide member;
  a planar motor constituted by magnets provided at one of either the base member or said table member and electromagnets provided at the remaining one of either said base member or said table member; and
  a movement control apparatus which controls said planar motor, so that drive force in directions parallel to the guide plane is generated to move said table member.

* * * * *